(12) United States Patent
Kamimurai et al.

(10) Patent No.: US 12,298,153 B2
(45) Date of Patent: May 13, 2025

(54) SEMICONDUCTOR DEVICE AND MULTI-TURN ENCODER

(71) Applicant: Mitsubishi Electric Corporation, Tokyo (JP)

(72) Inventors: Akio Kamimurai, Tokyo (JP); Takeshi Musha, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 90 days.

(21) Appl. No.: 18/247,784

(22) PCT Filed: Nov. 4, 2020

(86) PCT No.: PCT/JP2020/041207
§ 371 (c)(1),
(2) Date: Apr. 4, 2023

(87) PCT Pub. No.: WO2022/097199
PCT Pub. Date: May 12, 2022

(65) Prior Publication Data
US 2023/0417577 A1    Dec. 28, 2023

(51) Int. Cl.
*G01D 5/14* (2006.01)
*G01R 19/165* (2006.01)

(52) U.S. Cl.
CPC ......... *G01D 5/145* (2013.01); *G01R 19/1659* (2013.01)

(58) Field of Classification Search
CPC .............................. G01D 5/145; G01R 19/1659
See application file for complete search history.

(56) References Cited

U.S. PATENT DOCUMENTS 7,120,220 B2   10/2006   Du et al.
7,424,377 B2    9/2008   Hamilton et al.
(Continued)

FOREIGN PATENT DOCUMENTS

CN    104246444 A    12/2014
CN    107947637 A     4/2018
(Continued)

OTHER PUBLICATIONS

International Search Report (PCT/ISA/210) with English translation and Written Opinion (PCT/ISA/237) mailed on Dec. 22, 2020, by the Japanese Patent Office as the International Searching Authority for International Application No. PCT/JP2020/041207.
(Continued)

*Primary Examiner* — Walter L Lindsay, Jr.
*Assistant Examiner* — Milton Gonzalez
(74) *Attorney, Agent, or Firm* — Buchanan Ingersoll & Rooney PC

(57) ABSTRACT

An environmental power generation device outputs power generation charges to a power supply line to which a capacitor is connected. When a power generation voltage corresponding to a charging voltage for the capacitor is equal to or higher than an power-on criterion voltage, a voltage comparison circuit outputs a voltage detection signal. An internal circuit of a semiconductor device is powered on in response to the voltage detection signal. A setting change circuit switches the power-on criterion voltage in accordance with a setting input.

16 Claims, 15 Drawing Sheets

(56) References Cited

U.S. PATENT DOCUMENTS

| | | | |
|---|---|---|---|
| 8,680,694 B2* | 3/2014 | Parker | H02N 2/181 |
| | | | 290/1 R |
| 10,389,109 B2* | 8/2019 | Gao | H02S 50/10 |
| 10,545,728 B2 | 1/2020 | Khanna et al. | |
| 2015/0015245 A1 | 1/2015 | Inoue et al. | |
| 2016/0065070 A1 | 3/2016 | Noguchi et al. | |
| 2018/0043861 A1* | 2/2018 | Kosugi | G05B 19/042 |

FOREIGN PATENT DOCUMENTS

| | | |
|---|---|---|
| JP | 5511748 B2 | 4/2014 |
| JP | 5769879 B2 | 7/2015 |
| JP | 2016048973 A | 4/2016 |
| WO | 2019188859 A1 | 10/2019 |

OTHER PUBLICATIONS

First Office Action dated Feb. 24, 2025, issued in the corresponding Chinese Patent Application No. 202080106750.0, 14 pages including 7 pages of English Translation.

* cited by examiner

SEMICONDUCTOR DEVICE AND MULTI-TURN ENCODER

TECHNICAL FIELD

The present disclosure relates to a semiconductor device and a multi-turn encoder.

BACKGROUND ART

A semiconductor device which operates by using as power supply, electric power generated by an environmental power generation device to convert energy obtained from an ambient environment into electric power has been developed. Environmental power generation is also called energy harvest or energy harvesting. Exemplary environmental power generation includes vibration power generation, optical power generation, and temperature difference power generation, and in addition, energy can be obtained also from rotation of a motor or vibration. With the use of such an environmental power generation device as a power supply, a batteryless device without requiring a battery can be developed.

By way of example, Japanese Patent No. 5769879 (PTL 1) describes a batteryless multi-turn encoder to detect and hold a rotational direction of a rotational shaft and the number of rotations of the rotational shaft equal to or higher than one, with the use of electric power generated from rotational energy from a motor rotation shaft.

CITATION LIST

Patent Literature

PTL 1: Japanese Patent No. 5769879

SUMMARY OF INVENTION

Technical Problem

In a semiconductor device which uses as power supply, electric power generated by the environmental power generation device to intermittently generate electric power, generally, electric power is supplied through a capacitor where generated charges are accumulated. Depending on balance between electric power generated by the environmental power generation device and a capacitance value of the capacitor, an input voltage from the capacitor to the semiconductor device varies.

When the capacitance value of the capacitor is too small, there is a concern about such problems as a maximum value of an input voltage to the semiconductor device exceeding rating (a maximum operating voltage) or failure in ensuring time for power-on of an internal circuit of the semiconductor device because of too short time for rise of the input voltage. In contrast, when a capacitance of the capacitor is too large, there is a concern about a long time period required for the input voltage to the semiconductor device to increase to a voltage level at which the semiconductor device can operate. The capacitance value of the capacitor to supply an input voltage to the semiconductor device thus has to be adjusted to be balanced with electric power generated by the environmental power generation device.

When the capacitance value of the capacitor varies, on the other hand, relation between the input voltage to the semiconductor device and an amount of charges for charging of the capacitor (that is, energy) also varies. Consequently, an amount of charges necessary for the input voltage to increase to the voltage at which the semiconductor device can operate also varies depending on the capacitance value of the capacitor. Therefore, appropriate power on of the semiconductor device in conformity with the environmental power generation device different in generated power is difficult.

The present disclosure was made to solve such problems, and an object of the present disclosure is appropriate power on of a semiconductor device supplied with power supply from an environmental power generation device in conformity with difference in power generation capability of the environmental power generation device and to provide a multi-turn encoder to which the semiconductor device is applied.

Solution to Problem

In one aspect of the present disclosure, a semiconductor device connected to a power supply line to which power generation charges from an environmental power generation device are outputted includes a voltage comparison circuit, an internal circuit, and a setting change circuit. The voltage comparison circuit outputs a voltage detection signal when a power generation voltage corresponding to a charging voltage for a capacitor connected to the power supply line is equal to or higher than a power-on criterion voltage. The internal circuit is powered on in response to the voltage detection signal from the voltage comparison circuit. The setting change circuit switches the power-on criterion voltage in accordance with a first setting input.

According to another aspect of the present disclosure, a multi-turn encoder to detect the number of rotations of a rotation shaft includes the semiconductor device according to the present disclosure. The environmental power generation device is composed of a power generation element including a magnetic wire with a large Barkhausen effect, the magnetic wire being attached to a magnet that rotationally moves in coordination with the rotation shaft. The internal circuit is powered on each time a voltage pulse having the power generation voltage equal to or higher than the power-on criterion voltage is outputted from the power generation element and counts a multi-rotation value of the rotation shaft.

Advantageous Effects of Invention

According to the present disclosure, with the capacitance value of the capacitor being adjusted in conformity with power generation capability (an amount of charges) of the environmental power generation device, the power-on criterion voltage of the semiconductor device can be switched in accordance with an external setting input. Therefore, appropriate power-on in conformity with difference in power generation capability of the environmental power generation device can be achieved. A batteryless multi-turn encoder to which the semiconductor device is applied can thus be provided.

BRIEF DESCRIPTION OF DRAWINGS

FIG. 2 is a conceptual waveform diagram showing a first exemplary operation while the semiconductor is powered on.

FIG. 3 is a conceptual waveform diagram showing a second exemplary operation while the semiconductor is powered on.

FIG. 4 is a conceptual waveform diagram showing a third exemplary operation while the semiconductor is powered on.

FIG. 5 is a conceptual waveform diagram showing a fourth exemplary operation while the semiconductor is powered on.

FIG. 6 is a conceptual waveform diagram showing a fifth exemplary operation while the semiconductor is powered on.

DESCRIPTION OF EMBODIMENTS

Figure 1:
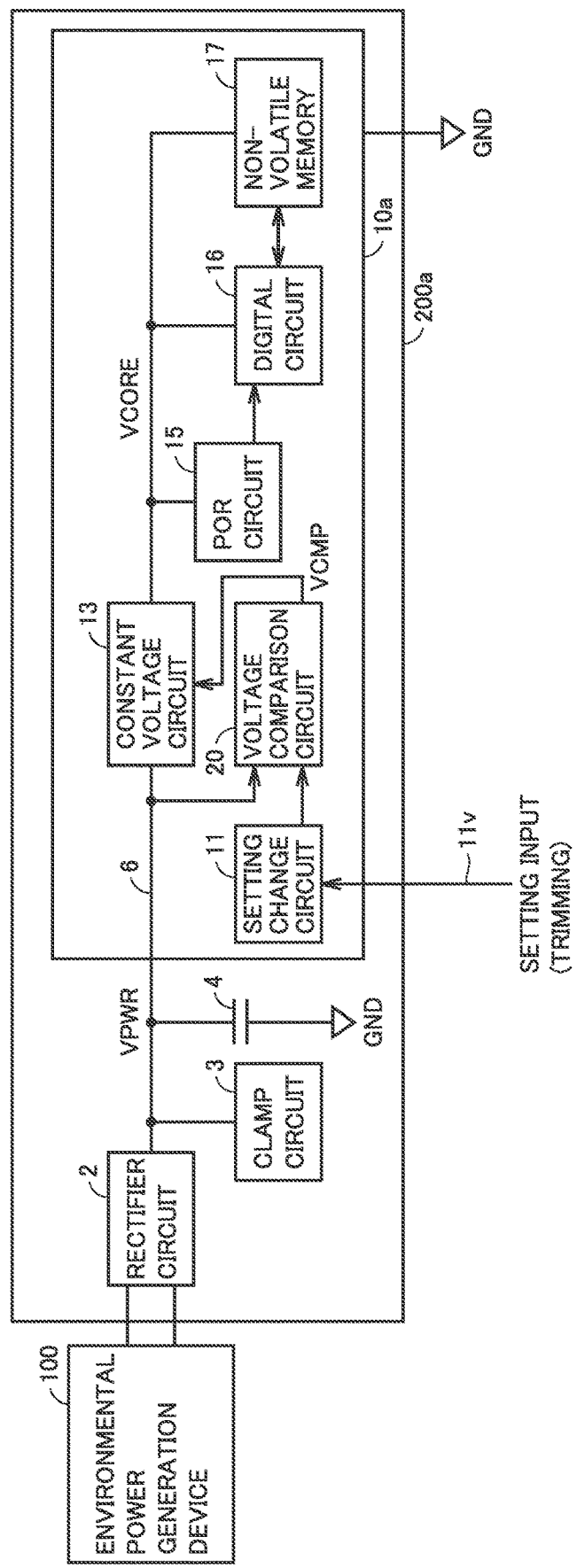
FIG. 1 is a block diagram illustrating a configuration of a semiconductor device according to a first embodiment.

An embodiment of the present disclosure will be described in detail below with reference to the drawings. The same or corresponding elements in the drawings below have the same reference characters allotted and description thereof will not be repeated in principle.

First Embodiment

FIG. 1 is a block diagram illustrating a configuration of a semiconductor device according to a first embodiment.

As shown in FIG. 1, a semiconductor device 10a according to the first embodiment operates by using as power supply, electric power generated by an environmental power generation device 100. A signal processor 200a on which semiconductor device 10a is mounted includes a rectifier circuit 2, a clamp circuit 3, and a capacitor 4 between environmental power generation device 100 and semiconductor device 10a.

In the present embodiment, an intermittent power generation element is assumed as environmental power generation device 100, and environmental power generation device 100 can be composed, for example, of a power generation element composed of a magnetic wire with a large Barkhausen effect and a pick-up coil as being combined, a power generation module composed of a magnetostrictive element and a pick-up coil as being combined, or a piezoelectric element to generate electric power by displacement of a piezo element. As a power generation pulse at a positive voltage and a power generation pulse at a negative voltage outputted from environmental power generation device 100 pass through rectifier circuit 2, power generation charges from environmental power generation device 100 are supplied to a power supply line 6.

Capacitor 4 and clamp circuit 3 are connected to power supply line 6. Capacitor 4 is charged with power generation charges from environmental power generation device 100. Therefore, since a voltage VPWR (which is also referred to as a "power generation voltage VPWR" below) on power supply line 6 corresponds to a charging voltage for capacitor 4, power generation voltage VPWR can be expressed as VPWR=Qch/Cch, where Qch represent charges for charging of capacitor 4 and Cch represents a capacitance value of capacitor 4.

Power generation voltage VPWR is inputted to semiconductor device 10a. Clamp circuit 3 is connected to power supply line 6 for protection against an overvoltage. Clamp circuit 3 is generally composed of a diode to conduct when power generation voltage VPWR exceeds a predetermined upper limit voltage Vmax, and operates as a protective circuit for ensuring a condition of VPWR≤Vmax.

Semiconductor device 10a includes a constant voltage circuit 13, a power on reset (POR) circuit 15, a digital circuit 16 where a function in accordance with an application is incorporated, and a non-volatile memory 17. A program and data to be used in digital circuit 16 and data or the like generated by digital circuit 16 are stored in non-volatile memory 17. Constant voltage circuit 13, digital circuit 16, and non-volatile memory 17 are shown as exemplary "internal circuits" of semiconductor device 10a.

Constant voltage circuit 13 generates a power supply voltage VCORE for digital circuit 16 and non-volatile memory 17 from power generation voltage VPWR of power supply line 6. When POR circuit 15 detects power supply voltage VCORE being in a state equal to or higher than a defined reset cancellation voltage in a stable manner at the time of power-on of power supply voltage VCORE from constant voltage circuit 13, POR circuit 15 generates a POR signal for cancelling a reset state of digital circuit 16.

Though the example in FIG. 1 shows a configuration in which digital circuit 16 and non-volatile memory 17 operate with power supply voltage VCORE from common constant voltage circuit 13, different power supply voltages from different constant voltage circuits may be supplied to digital circuit 16 and non-volatile memory 17, respectively. Alternatively, the power supply voltage for one of digital circuit 16 and non-volatile memory 17 can also be generated by the constant voltage circuit, and the power supply voltage for the other can also be generated by boosting or lowering the power supply voltage.

Though rectifier circuit 2 and clamp circuit 3 are arranged outside semiconductor device 10a in the example in FIG. 1, rectifier circuit 2 and clamp circuit 3 can also be mounted in the inside of semiconductor device 10a. In contrast, non-volatile memory 17 can also be arranged outside semiconductor device 10a.

Semiconductor device 10a further includes a voltage comparison circuit 20 to compare power generation voltage VPWR on power supply line 6 and a power-on criterion voltage Vdet with each other and a setting change circuit 11 to switch power-on criterion voltage Vdet in accordance with a setting input 11v from the outside of semiconductor device 10a. When power generation voltage VPWR on power supply line 6 becomes equal to or higher than power-on criterion voltage Vdet, voltage comparison circuit 20 generates a voltage detection signal VCMP. Constant voltage circuit 13 is powered on in response to voltage detection signal VCMP.

A series of operations of semiconductor device 10a will be described. As power generation pulses from environmental power generation device 100 are rectified by rectifier circuit 2 and charged to capacitor 4, power generation voltage VPWR increases. When voltage comparison circuit 20 detects that power generation voltage VPWR has become equal to or higher than power-on criterion voltage Vdet variably set by setting change circuit 11, constant voltage circuit 13 is powered on. Power-on of constant voltage circuit 13 is also referred to as power-on of semiconductor device 10a below.

Digital circuit 16 starts to operate as a reset state thereof is cancelled in response to the POR signal (POR circuit 15) with increase in power supply voltage VCORE. Digital circuit 16 thus starts processing incorporated in advance. While digital circuit 16 operates, data is inputted and outputted (read and written) between digital circuit 16 and non-volatile memory 17.

Semiconductor device 10a should be powered on after capacitor 4 is charged with an amount of charges (energy consumption in semiconductor device 10) necessary from start until completion of processing. This is because, when processing in semiconductor device 10a is started in expectation of subsequent supply of power generation charges with the capacitor not having been charged with the necessary amount of charges, subsequently, a failure mode in which environmental power generation device 100 is unable to generate a necessary amount of charges before processing in semiconductor device 10a is completed may be likely. In particular, in an example where a destructive read memory such as a ferroelectric random access memory (FeRAM) is applied as non-volatile memory 17, there is a concern about a destruction mode where data in non-volatile memory 17 is lost when processing in semiconductor device 10a is aborted before completion thereof due to lowering in power supply voltage VCORE caused by lack of the amount of charges.

An exemplary operation while semiconductor device 10a is powered on will be described with reference to exemplary waveforms of power generation voltage VPWR and power supply voltage VCORE in FIGS. 2 to 6.

Figure 2:
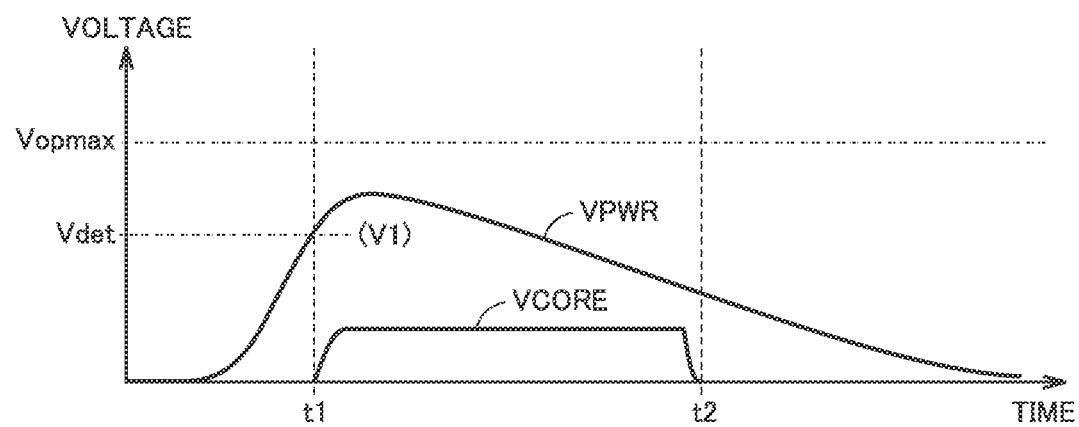

In FIG. 2, as power generation charges from environmental power generation device 100 are charged to capacitor 4, power generation voltage VPWR increases.

When power generation voltage VPWR becomes equal to or higher than power-on criterion voltage Vdet (V1) at time t1, constant voltage circuit 13 is powered on in response to voltage detection signal VCMP. Generation of power supply voltage VCORE is thus started.

After semiconductor device 10a is powered on, power supply voltage VCORE is maintained constant by constant voltage circuit 13. On the other hand, since charges of capacitor 4 are released as energy is consumed in digital circuit 16 and non-volatile memory 17, power generation voltage VPWR gradually lowers. As processing by digital circuit 16 and non-volatile memory 17 is completed, at time t2, constant voltage circuit 13 stops generation of power supply voltage VCORE.

In the example in FIG. 2, the capacitance value of capacitor 4 with respect to power generation capability (the amount of charges) of environmental power generation device 100 is adjusted such that a maximum value of power generation voltage VPWR does not exceed a maximum operating voltage Vopmax of semiconductor device 10a.

In FIG. 2, an amount of charges Qopr1 charged to capacitor 4 at a time point of time t1 is expressed in an expression (1) below, where Cchg1 represents the capacitance value of capacitor 4.

$$Qopr1 = V1 \cdot Cchg1 \tag{1}$$

Figure 3:
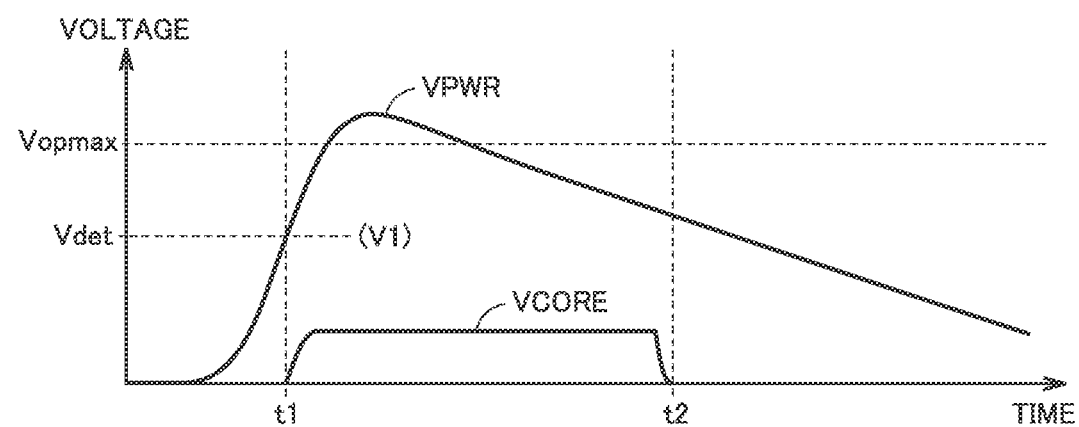

FIG. 3 shows an exemplary operation waveform when power generation capability (the amount of charges) of environmental power generation device 100 is higher than in FIG. 2.

In FIG. 3, energy (the amount of charges) consumed by processing in digital circuit 16 and non-volatile memory 17 and the capacitance value of capacitor 4 are identical to those in FIG. 2. On the other hand, the amount of charges outputted from environmental power generation device 100 to power supply line 6 is larger than in FIG. 2.

Consequently, the maximum value of power generation voltage VPWR exceeds maximum operating voltage Vopmax of semiconductor device 10a. Conversely speaking, the capacitance value of capacitor 4 should be adjusted such that the maximum value of power generation voltage VPWR is lower than maximum operating voltage Vopmax in accordance with power generation capability (the amount of charges) of environmental power generation device 100.

Figure 4:
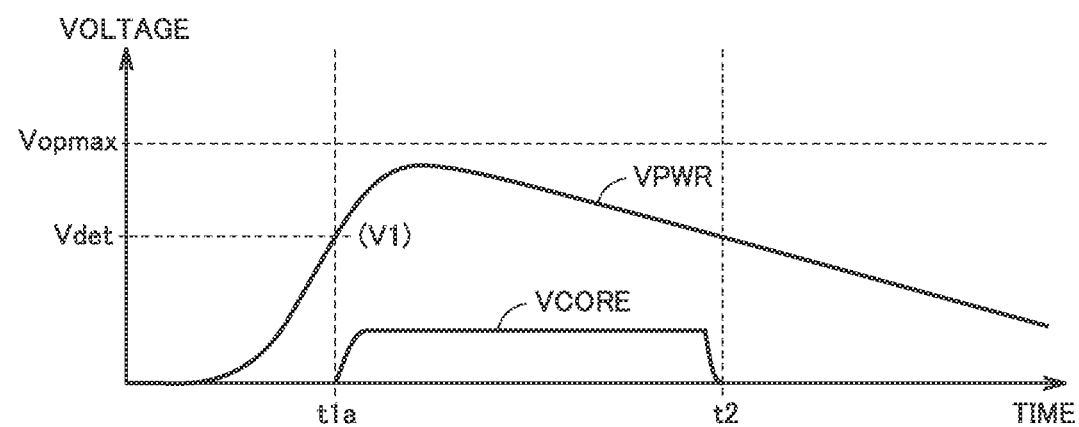

FIG. 4 shows an operation waveform when the capacitance value of capacitor 4 is adjusted such that the maximum value of power generation voltage VPWR does not exceed maximum operating voltage Vopmax in the case in FIG. 3.

In FIG. 4, as the capacitance value of capacitor 4 is set to Cchg2 (Cchg2>Cchg1), the maximum value of power generation voltage VPWR becomes lower than maximum operating voltage Vopmax.

On the other hand, again in FIG. 4, timing of power-on of semiconductor device 10a is determined based on power-on criterion voltage Vdet=V1 as in FIGS. 2 and 3. Therefore, an amount of charges Qopr2 charged to capacitor 4 at time t1a when a condition of VPWR≥Vdet (V1) is satisfied is expressed in an expression (2) below, where Cchg2 represents the capacitance value of capacitor 4.

$$Qopr2 = V1 \cdot Cchg2 \tag{2}$$

Since relation of Cchg2>Cchg1 is satisfied, relation of Qopr2>Qopr1 is satisfied. In other words, as the capacitance value of capacitor 4 is larger, the amount of charges necessary for increasing power generation voltage VPWR to identical power-on criterion voltage Vdet is also larger.

On the other hand, it is understood that, since the capacitance value of capacitor 4 is increased from Cchg1 to Cchg2, charging by the amount of charges necessary until completion of processing in semiconductor device 10a is done while power generation voltage VPWR is lower than V1 (Vdet=V1) in the case in FIG. 4. In other words, power-on criterion voltage Vdet being set to V1 in the case in FIG. 4 as in FIG. 2 is equivalent to undue increase in amount of charges necessary for power-on of semiconductor device 10a.

Then, the present embodiment is characterized in that power-on criterion voltage Vdet can variably be set in accordance with setting input 11v to setting change circuit 11. Power-on criterion voltage Vdet can thus be varied in conformity with adjustment of the capacitance value of capacitor 4 where power generation charges from environmental power generation device 100 are accumulated.

Figure 5:
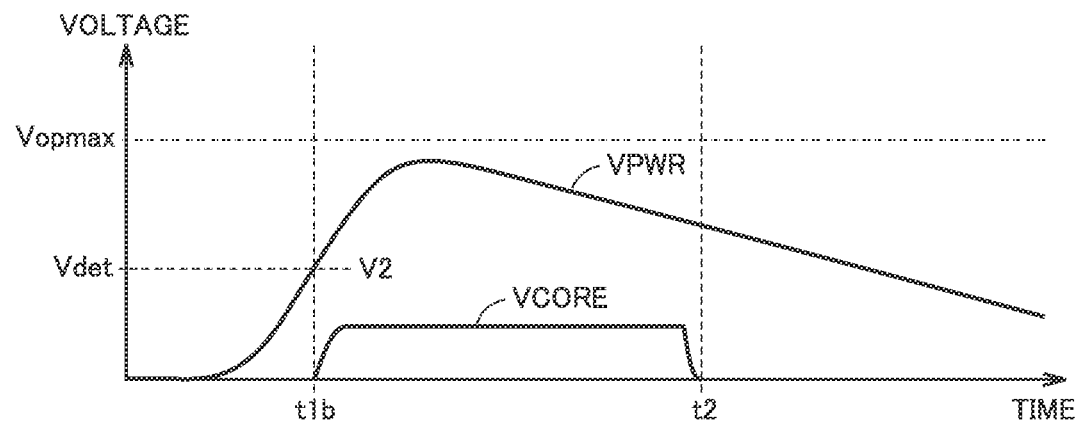

FIG. 5 shows an operation waveform diagram when power-on criterion voltage Vdet is lowered as compared with the case in FIG. 4.

In FIG. 5, the maximum value of power generation voltage VPWR is lower than maximum operating voltage Vopmax by using the capacitance value (Cchg2) of capacitor 4 as in FIG. 4. Furthermore, by setting power-on criterion voltage Vdet to Vdet=V2 (V2<V1), at time t1b, upon generation of voltage detection signal VCMP, semiconductor device 10a can be powered on with the amount of charges smaller than the amount of charges charged to capacitor 4 at time t1a in FIG. 4.

An amount of charges Qopr3 charged to capacitor 4 at a time point of time t1b in FIG. 5 is expressed in an expression (3) below, where Cchg2 represents the capacitance value of capacitor 4.

$$Qopr3 = V2 \cdot Cchg2 \quad (3)$$

It is understood that, in order to set amount of charges Qopr3 in the expression (3) to be equal to amount of charges Qopr1 in the expression (1), power-on criterion voltage Vdet (Vdet=V2) in FIG. 5 should be set in accordance with an expression (4) below. Therefore, when a condition of Cchg2>Cchg1 is satisfied, a condition of V2<V1 is satisfied and power-on criterion voltage Vdet is variably set to a relatively low voltage as the capacitance value of capacitor 4 is larger.

$$V2 = V1 \cdot (Cchg1/Cchg2) \quad (4)$$

As will be described later, it is difficult to set power-on criterion voltage Vdet to a completely arbitrary value. Therefore, preferably, power-on criterion voltage Vdet (Vdet=V2) in FIG. 5 is set to a lowest voltage of a plurality of voltage values that can be set stepwise within a range that satisfies an expression (5) below, in accordance with setting input 11v.

$$V2 \geq V1 \cdot (Cchg1/Cchg2) \quad (5)$$

An example in which the capacitance value of capacitor 4 is adjusted based on relation between power generation voltage VPWR and maximum operating voltage Vopmax is described with reference to FIGS. 2 to 5. On the other hand, when power generation capability (the amount of charges) of environmental power generation device 100 is lower than in FIG. 2 in contrast to FIG. 3, there is a concern about power generation voltage VPWR being unable to reach power-on criterion voltage Vdet and failure to start processing in semiconductor device 10a. Therefore, in such a case, adjustment to decrease the capacitance value of capacitor 4 is required in contrast to the above.

As the capacitance value of capacitor 4 is made smaller, however, the amount of charges charged to capacitor 4 at identical power-on criterion voltage Vdet becomes smaller. Therefore, in order to ensure the amount of charges necessary until completion of processing in semiconductor device 10a, power-on criterion voltage Vdet should be set to be higher than in FIG. 2.

Furthermore, there may also be a case where, from a point of view of time for rise of power generation voltage VPWR, the capacitance value of capacitor 4 has to be adjusted.

Figure 6:
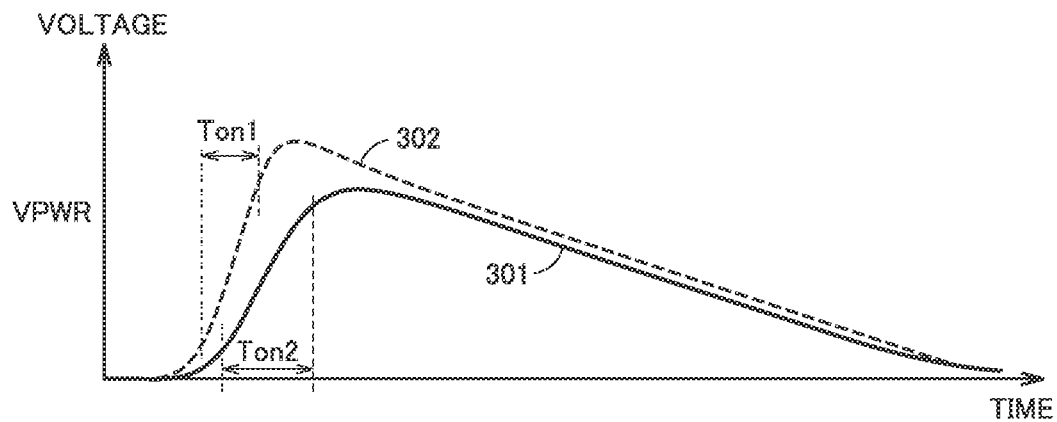

When the capacitance value of capacitor 4 is changed for the same environmental power generation device 100 as shown in FIG. 6, time for rise of power generation voltage VPWR also changes. As this time for rise is shorter than the time for rise allowable by semiconductor device 10a, defective power-on of semiconductor device 10a becomes a concern. For example, in semiconductor device 10a, a certain time period for preparation is required before voltage comparison circuit 20 to compare power generation voltage VPWR and power-on criterion voltage Vdet with each other starts operating. The allowable time for rise described above is set as a specification value for ensuring time for preparation.

For example, a case is assumed in which time for rise Ton1 when the capacitance value of capacitor 4 is set to Cchg1 is shorter than time for rise allowable by semiconductor device 10a whereas time for rise Ton2 when the capacitance value of capacitor 4 is set to Cchg2 (Cchg2>Cchg1) is longer than the allowable time for rise.

In such a case, the capacitance value of capacitor 4 should be set to Cchg2 in conformity with power generation capability (the amount of charges) of environmental power generation device 100. In this case as well, as described with reference to FIG. 4, power-on criterion voltage Vdet is preferably lowered as compared with that in the example where the capacitance value of capacitor 4 is set to Cchg1.

Thus, the capacitance value of the capacitor to be charged with power generation charges should be adjusted in conformity with power generation capability (the amount of charges) of environmental power generation device 100. With the capacitance value of capacitor 4 being adjusted as such, in semiconductor device 10a according to the present embodiment, power-on criterion voltage Vdet to be compared with power generation voltage VPWR is switchable so that adaptation to environmental power generation device 100 different in characteristic can be made without undue increase in amount of charges necessary for power-on of semiconductor device 10a.

An exemplary configuration of setting change circuit 11 and voltage comparison circuit 20 for switching setting of power-on criterion voltage Vdet will now be described.

Figure 7:
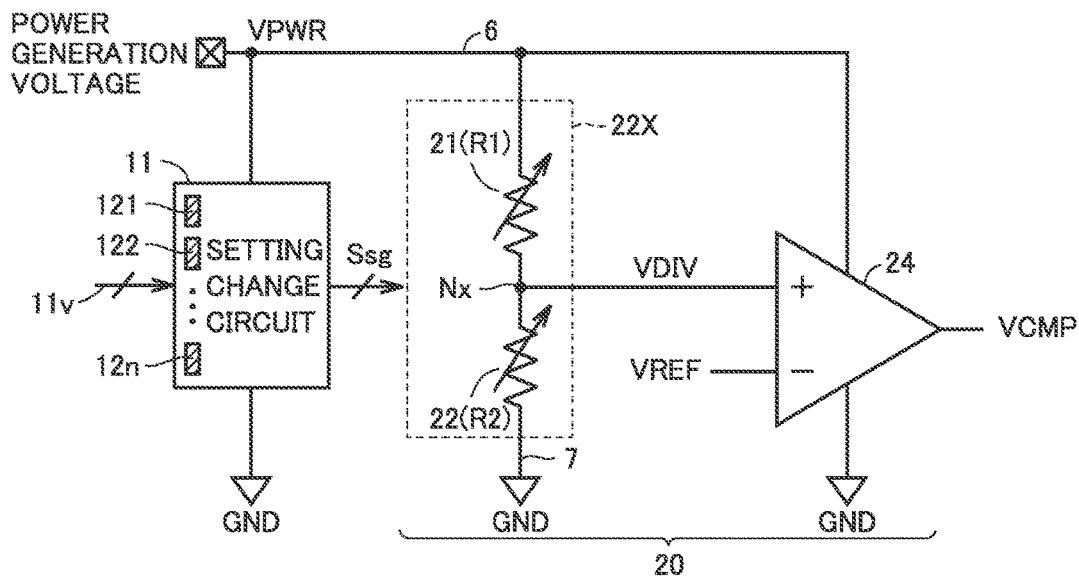
FIG. 7 is a block diagram illustrating a first exemplary configuration of a setting change circuit and a voltage comparison circuit shown in FIG. 1.

FIG. 7 shows a first exemplary configuration of setting change circuit 11 and voltage comparison circuit 20.

Setting change circuit 11 generates a control signal Ssg for switching setting of power-on criterion voltage Vdet. Control signal Ssg should be set before digital circuit 16 is powered on. Therefore, setting change circuit 11 cannot be configured with non-volatile memory 17 from which data is read by digital circuit 16.

Setting change circuit 11 is provided with a trimming element 12 such as a metal fuse, a polysilicon fuse, and a Zener zap for which a reading operation is not required. For example, n (n being an integer not smaller than two) trimming elements 121 to 12n are contained in setting change circuit 11.

Each trimming element 12 is configured to make irreversible transition between a non-broken state and a broken state by irradiation with laser or a trimming input such as a voltage input and a current input, that is, configured to be capable of trimming. As power generation voltage VPWR is applied, depending on whether each trimming element 12 is in the non-broken state or the broken state, a one-bit digital signal for which a ground voltage GND is defined as a logic low level (the "L level" below) and power generation voltage VPWR is defined as a logic high level (the "H level" below) can be generated. Therefore, setting change circuit 11 can generate n-bit control signal Ssg with a trimming input to n trimming elements 121 to 12n being defined as setting input 11v.

In the case of trimming by irradiation with laser, setting input 11v to setting change circuit 11 is generally set in a process for manufacturing semiconductor device 10a. Alternatively, in the case of trimming by a voltage input or a current input, the setting input may be set in the process for manufacturing semiconductor device 10a, or may be set by means of a control circuit (not shown) such as a microcomputer after semiconductor device 10a is mounted on a substrate. Thus, setting input 11v is inputted to setting change circuit 11 from an external element different from a constituent element of semiconductor device 10a, that is, from the outside of semiconductor device 10a, at least one timing of timing before (during manufacturing) and timing after completion of semiconductor device 10a.

As shown in FIG. 7, voltage comparison circuit 20 includes a voltage division circuit 22X and a comparator 24. Voltage division circuit 22X includes a resistive element 21 (an electrical resistance value R1) connected between power supply line 6 and a node Nx and a resistive element 22 (an electrical resistance value R2) connected between node Nx and a ground line 7.

Voltage division circuit 22X outputs to node Nx, a divided voltage VDIV resulting from voltage division of power generation voltage VPWR by resistive elements 21 and 22. VDIV is shown as VDIV=Kr·VPWR (Kr<1.0) where Kr (Kr=R2/(R1+R2)) represents a voltage division ratio of voltage division circuit 22X.

Comparator 24 compares divided voltage VDIV and a constant reference voltage VREF with each other. When a condition of VDIV≥VREF is detected, an output voltage from comparator 24 changes from the L level to the H level. Voltage detection signal VCMP is thus outputted from comparator 24.

Therefore, in order to generate voltage detection signal VCMP at the time when power generation voltage VPWR attains to power-on criterion voltage Vdet or higher (VPWR≥Vdet), relation in an expression (6) below is satisfied among reference voltage VREF, power-on criterion voltage Vdet, and voltage division ratio Kr.

$$V\text{det}=V\text{REF}/Kr \quad (6)$$

At least one of resistive elements 21 and 22 in voltage division circuit 22X is composed of a variable resistive element variable in electrical resistance value in accordance with control signal Ssg. In the example in FIG. 7, each of resistive elements 21 and 22 is composed of a variable resistive element. Consequently, by varying the electrical resistance value of resistive element 21 and/or resistive element 22 in accordance with control signal Ssg, voltage division ratio Kr of voltage division circuit 22X can be varied.

Thus, by varying voltage division ratio Kr in the expression (6) in accordance with control signal Ssg while reference voltage VREF is constant, power-on criterion voltage Vdet can variably be set.

Figure 8:
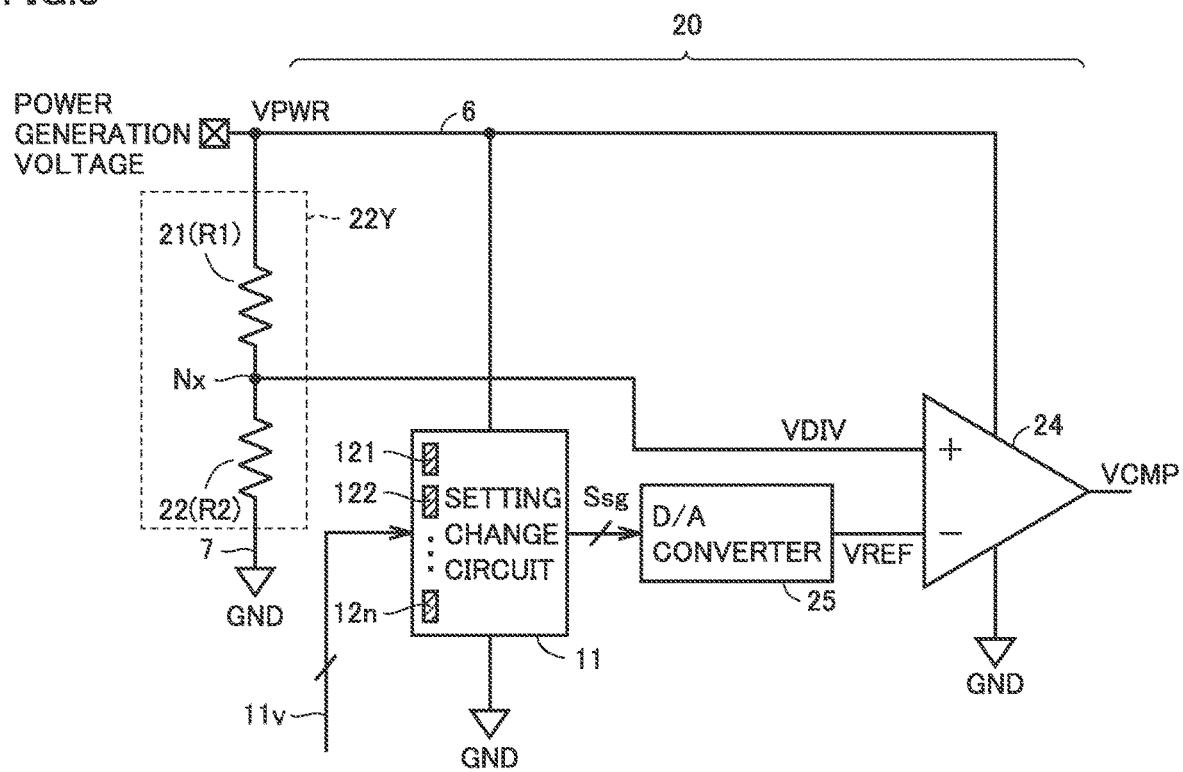
FIG. 8 is a block diagram illustrating a second exemplary configuration of the setting change circuit and the voltage comparison circuit.

FIG. 8 shows a second exemplary configuration of setting change circuit 11 and voltage comparison circuit 20.

In the exemplary configuration shown in FIG. 8, voltage comparison circuit 20 includes a voltage division circuit 22Y, comparator 24, and a digital-analog (D/A) converter 25.

Voltage division circuit 22Y outputs to node Nx, divided voltage VDIV resulting from voltage division by resistive elements 21 and 22 (VDIV=Kr≥VPWR). The electrical resistance value of resistive elements 21 and 22 is fixed, and voltage division ratio Kr (Kr=R2/(R1+R2)) of voltage division circuit 22Y is set to a constant value.

Control signal Ssg from setting change circuit 11 configured as in FIG. 7 is inputted to D/A converter 25 to generate reference voltage VREF. D/A converter 25 generates an analog voltage resulting from analog conversion of multiple-bit control signal Ssg as reference voltage VREF. In other words, D/A converter 25 corresponds to one embodiment of the "voltage generator."

In the exemplary configuration in FIG. 8, by varying reference voltage VREF in the expression (6) in accordance with control signal Ssg while voltage division ratio Kr is constant, power-on criterion voltage Vdet can variably be set.

Figure 9:
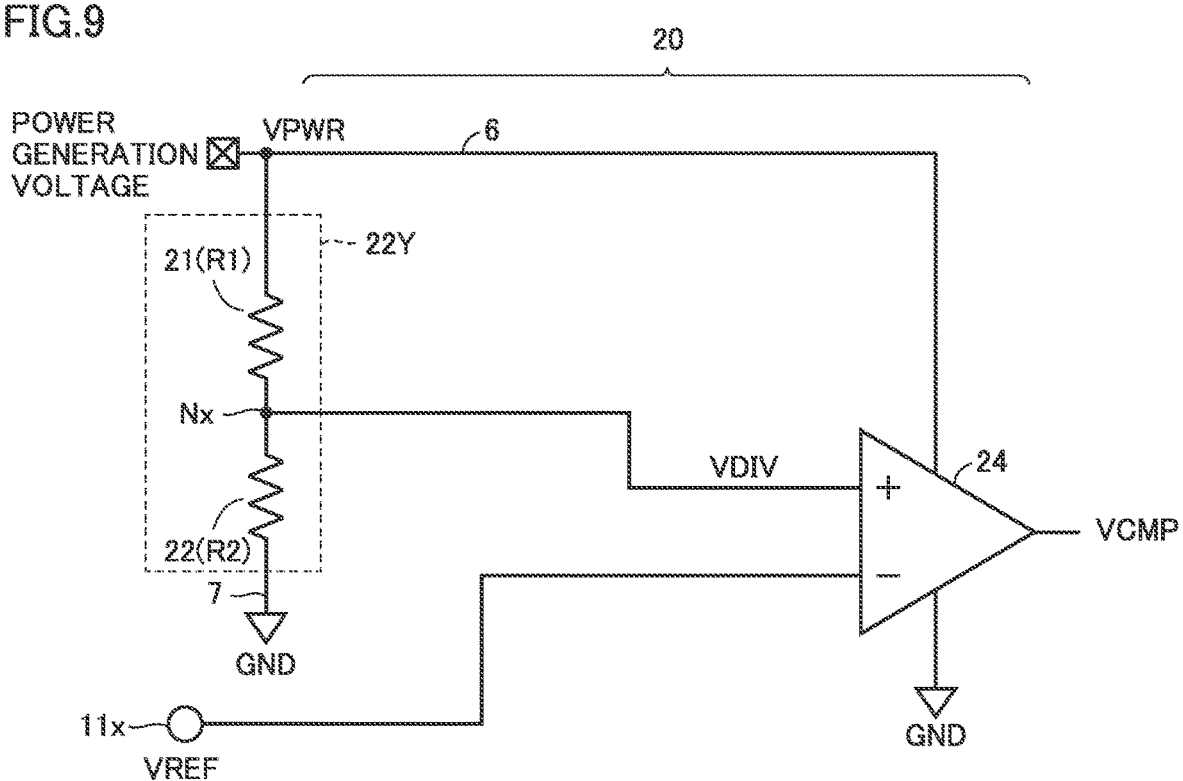
FIG. 9 is a block diagram illustrating a third exemplary configuration of the setting change circuit and the voltage comparison circuit.

Alternatively, as shown in FIG. 9, reference voltage VREF can also be inputted by using a terminal 11x provided to receive input of an analog voltage from the outside of semiconductor device 10a. In this case, setting change circuit 11 is configured by variably setting power-on criterion voltage Vdet from the outside of semiconductor device 10a based on the analog voltage to terminal 11x.

Thus, in semiconductor device 10a, power-on criterion voltage Vdet to be compared with power generation voltage VPWR by voltage comparison circuit 20 can be switched in accordance with setting input 11v to setting change circuit 11. Thus, with the capacitance value of the capacitor charged with power generation charges being appropriately adjusted for environmental power generation device 100 different in characteristic, semiconductor device 10a can appropriately be powered on in accordance with the ensured amount of charges necessary for processing in semiconductor device 10a. The semiconductor device can thus be used as being adapted to various environmental power generation devices. Conversely speaking, an appropriate environmental power generation device can also be selected in accordance with a product on which the semiconductor device is mounted.

For example, when semiconductor device 10a according to the present embodiment is applied to a product mounted on a small-sized substrate, environmental power generation device 100 small in amount of power generation charges but small also in dimension and expensive is employed. Therefore, in semiconductor device 10a, power-on criterion voltage Vdet can be set to be relatively high based on setting input 11v to setting change circuit 11 so as to be adapted to the capacitance value of capacitor 4 adjusted in accordance with power generation capability (the amount of charges) of environmental power generation device 100.

On the other hand, when semiconductor device 10a according to the present embodiment is applied to a product mounted on a large-sized substrate, environmental power generation device 100 large in amount of power generation charges and in dimension and inexpensive can be employed. Therefore, in semiconductor device 10a, power-on criterion voltage Vdet can be set to be relatively low based on setting input 11v to setting change circuit 11 so as to be adapted to the capacitance value of capacitor 4 adjusted in accordance with power generation capability (the amount of charges) of environmental power generation device 100. Semiconductor device 10a according to the first embodiment can thus be higher in general applicability to environmental power generation device 100.

Modification of First Embodiment

Further detailed setting of power-on criterion voltage Vdet in semiconductor device 10a in the first embodiment will be described in a modification of the first embodiment.

Figure 10:
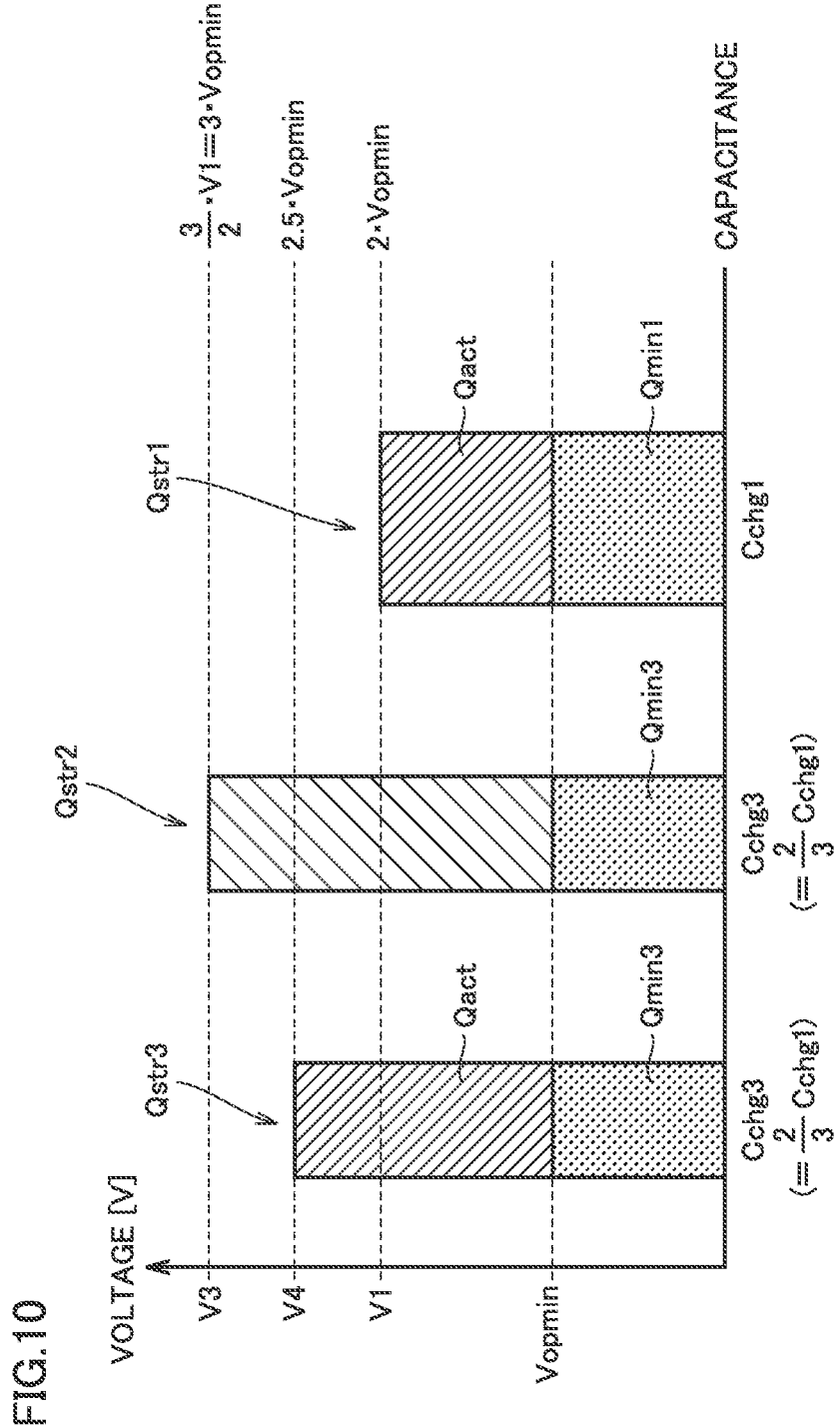
FIG. 10 shows a conceptual bar graph for illustrating setting of a power-on criterion voltage according to a modification of the first embodiment.

FIG. 10 shows a conceptual bar graph for illustrating setting of the power-on criterion voltage according to the first embodiment. A width along the abscissa in FIG. 10 represents the capacitance value of capacitor 4 and a length along the ordinate represents power-on criterion voltage Vdet. Therefore, an area of each bar is a product of the capacitance value and the voltage value, and represents the amount of charges with which capacitor 4 is charged at the time point when power generation voltage VPWR attains to power-on criterion voltage Vdet (that is, semiconductor device 10a is powered on).

On the ordinate in FIG. 10, a minimum operating voltage Vopmin of semiconductor device 10a is shown. Minimum operating voltage Vopmin is set as a specification value representing a lower limit value of an input power supply voltage at which semiconductor device 10a can operate. In the example in FIG. 1, with power supply voltage VCORE from constant voltage circuit 13 being set to 1.8 [V], power generation voltage VPWR to be the input voltage to constant voltage circuit 13 should be higher than 1.8 [V] by 0.2 to 0.3 [V]. Therefore, for example, minimum operating voltage Vopmin is around 2.0 [V].

At the time of power-on of semiconductor device 10a, the sum of an amount of charges Qmin for power generation voltage VPWR to reach minimum operating voltage Vopmin and an amount of charges Qact consumed by semiconductor device 10a during a period from start until completion of processing incorporated in advance should be accumulated in capacitor 4. Amount of charges Qmin is understood to vary depending on the capacitance value of capacitor 4.

On the other hand, amount of charges Qact corresponds to energy (the amount of charges) consumed in operations by constant voltage circuit 13, POR circuit 15, digital circuit 16, and non-volatile memory 17 when semiconductor device 10a performs the processing incorporated in advance. Therefore, since amount of charges Qact is determined by a circuit configuration and processing contents of semiconductor device 10a, it is not dependent on the capacitance value of capacitor 4.

Therefore, it is understood that an amount of charges Qstr (Qstr=Qact+Qmin) necessary while semiconductor device 10a is powered on is varied depending on the capacitance value of capacitor 4 and that amount of charges Qstr is smaller as the capacitance value is smaller.

At the right end of FIG. 10, amounts of charges Qmin1 and Qact at the time when power-on criterion voltage Vdet is set to Vdet=V1 for capacitance value Cchg1 of capacitor 4 described with reference to FIG. 2 are shown. Qmin1 is expressed as a product of capacitance value Cchg1 and minimum operating voltage Vopmin. V1 is set to V1=2·Vopmin. In the case at the right end, amount of charges Qstr1 with which capacitor 4 is charged at the time of power-on of semiconductor device 10a is shown as Qstr1=V1·Cchg1=2·Vopmin·Cchg1.

Setting of power-on criterion voltage Vdet in a case where the capacitance value of capacitor 4 is set to Cchg3 which is (2/3) time as large as Cchg1 (Cchg3=(2/3)·Cchg1) in order to adapt to environmental power generation device 100 different in specification is considered.

In the center in FIG. 10, a case where power-on criterion voltage Vdet is set to Vdet=V3 (that is, V3=(3/2)·V1=3·Vopmin) in accordance with a ratio of the capacitance value of capacitor 4 based on the expression (4) described above is shown. In this case, it is understood that an amount of charges Qstr2 with which capacitor 4 is charged at processing start time is shown as Qstr2=V3·Cchg3=(3/2)·V1·(2/3)·Cchg1=V1·Cchg1=Qstr1.

On the other hand, in the case in the center, with lowering in capacitance value of capacitor 4, an amount of charges Qmin3 for ensuring minimum operating voltage Vopmin is smaller than amount of charges Qmin1 in the case at the right end. Therefore, it is understood that an amount of charges (Qstr2−Qmin3) is larger than amount of charges Qact consumed by semiconductor device 10a and amount of charges Qstr2 is excessive for a minimum necessary amount of charges Qmin3+Qact.

At the left end in FIG. 10, exemplary setting of power-on criterion voltage Vdet according to the modification of the first embodiment is shown. In the case at the left end, power-on criterion voltage Vdet is set to Vdet=V4 such that an amount of charges Qstr3 with which capacitor 4 is charged at processing start time is the sum of amount of charges Qmin3 for ensuring minimum operating voltage Vopmin and amount of charges Qact consumed by processing in semiconductor device 10a.

As described above, amount of charges Qmin3 is expressed as Qmin3=Cchg3·Vopmin depending on capacitance value Cchg3 of capacitor 4. On the other hand, amount of charges Qact is the same in value as in the case (Qstr1) at the right end, without depending on the capacitance value of capacitor 4.

In the case at the right end, based on V1=2·Vopmin, Qact is expressed as Qact=Cchg1·(V1−Vopmin)=Cchg1·(2·Vopmin−Vopmin)=Cchg1·Vopmin. Therefore, in the case at the left end, based on Cchg3=(2/3)·Cchg1, Qact can be expressed as Qact=(3/2)·Cchg3·Vopmin. As in the case in the center, Qmin3 is expressed as Qmin3=Cchg3·Vopmin. Consequently, since Qstr3 is expressed as Qstr3=Qmin3+Qact=(5/2)·Cchg3·Vopmin, setting as Vdet=V4=2.5·Vopmin can be made.

Consequently, in the case at the left end according to the modification of the first embodiment, power-on criterion voltage Vdet can be set to be lower than in the case in the center in accordance with the expression (5). Semiconductor device 10 can thus appropriately be powered on with the amount of charges smaller than in the first embodiment.

Summarizing the above, in the modification of the first embodiment, power-on criterion voltage Vdet can be set in accordance with an expression (7) below, based on minimum operating voltage Vopmin as the specification value, amount of consumed charges Qact for semiconductor device 10a to perform processing incorporated in advance, and capacitance value Cchg of the capacitor charged with the amount of power generation charges from environmental power generation device 100. Amount of consumed charges Qact can be determined in advance based on an actually measured value of consumed power or a value designed by simulation.

$$Vdet = Vopmin + (Qact/Cchg) \qquad (7)$$

With setting of power-on criterion voltage Vdet according to the modification of the first embodiment, general applicability of semiconductor device 10a is enhanced so as to be adapted to environmental power generation device 100 small in amount of power generation charges.

Second Embodiment

Figure 11:
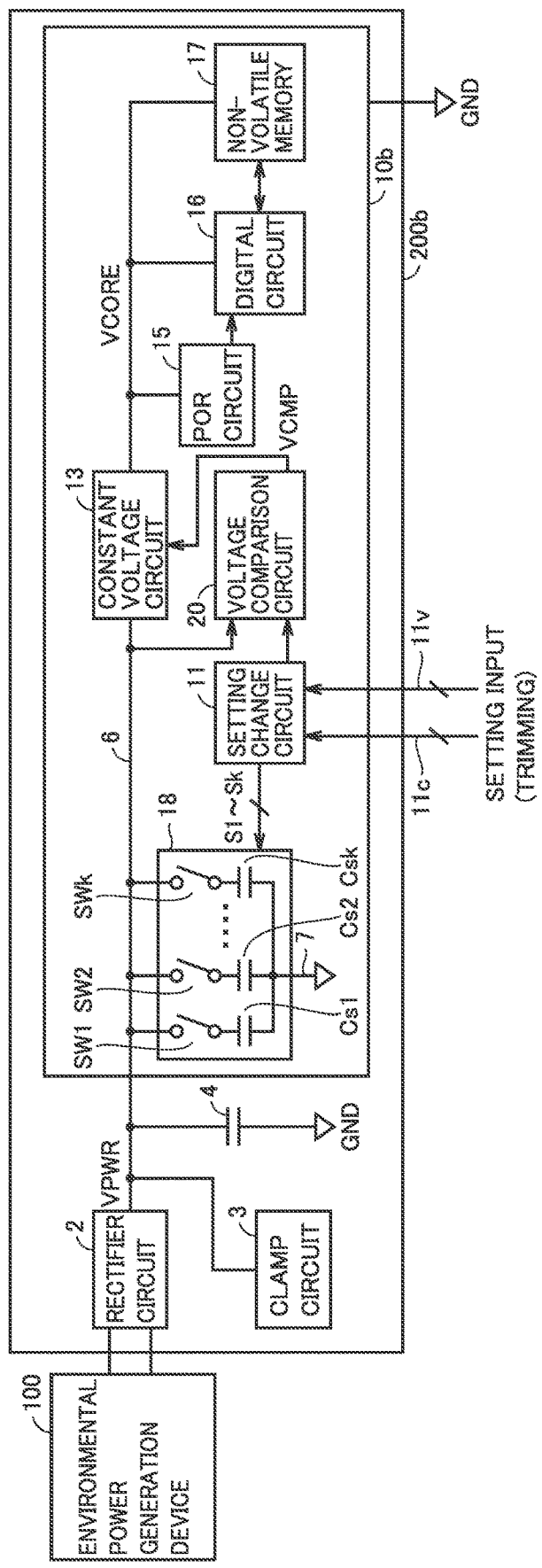
FIG. 11 is a block diagram illustrating a configuration of a semiconductor device according to a second embodiment.

FIG. 11 is a block diagram illustrating a configuration of a semiconductor device according to a second embodiment.

As shown in FIG. 11, a semiconductor device 10b according to the second embodiment is mounted on a signal processor 200b. Signal processor 200b is different from signal processor 200a shown in FIG. 1 in including semiconductor device 10b instead of semiconductor device 10a.

Semiconductor device 10b according to the second embodiment is different from semiconductor device 10a according to the first embodiment in further including a capacitance value adjustment circuit 18 connected to power supply line 6. Since semiconductor device 10b is otherwise similar in configuration to semiconductor device 10a, detailed description will not be repeated.

Capacitance value adjustment circuit 18 includes k (k being a natural number) sets of a sub capacitor Cs and a switch SW connected in series between power supply line 6 and ground line 7. When a condition of k≥2 is set, a plurality of sets of sub capacitor Cs and switch SW connected in series are connected in parallel between power supply line 6 and ground line 7.

FIG. 11 shows an example where a condition of k≥3 is set, and a set of a sub capacitor Cs1 and a switch SW1, a set of a sub capacitor Cs2 and a switch SW2, . . . , and a set of a sub capacitor Csk and a switch SWk are connected in parallel between power supply line 6 and ground line 7.

On and off of k switches is controlled by control signals S1 to Sk from setting change circuit 11. Control signals S1 to Sk can be generated similarly to control signal Ssg described above, by increasing the number of arranged trimming elements 12 in setting change circuit 11. In other words, control signals S1 to Sk can also be generated in accordance with a setting input 11c to setting change circuit 11 corresponding to a trimming input. Setting input 11c is also inputted to setting change circuit 11 similarly to setting input 11v described above.

Consequently, in capacitance value adjustment circuit 18, at least one or all of sub capacitors Cs1 to Csk can be connected to power supply line 6 and used for charging with power generation charges from environmental power generation device 100. In other words, sub capacitor Cs additionally connected to power supply line 6 in accordance with control signals S1 to Sk corresponds to an "auxiliary capacitor."

Capacitor 4 is connected to power supply line 6 as a main capacitor as in the first embodiment. Power generation charges from environmental power generation device 100 are thus provided to both of capacitor 4 and sub capacitor Cs additionally connected owing to capacitance value adjustment circuit 18. Then, an additional capacitance value resulting from connection of the sub capacitor in capacitance value adjustment circuit 18 can variably be set in accordance with control signals S1 to Sk, that is, setting input 11c to setting change circuit 11.

Therefore, in semiconductor device 10b according to the second embodiment, with arrangement of capacitance value adjustment circuit 18, a total capacitance value of capacitors charged with power generation charges from environmental power generation device 100 can be adjusted based on setting input 11c to setting change circuit 11.

Even when environmental power generation devices 100 are products of the same product number, they may be different in power generation capability depending on mass production lots (difference in material, time and date of manufacturing, a manufacturing apparatus, or the like) due to variation in manufacturing. Therefore, environmental power generation devices of the same product number include individuals low in generated power and individuals high in generated power, although the difference is not as large as that in an example where the product number is different.

Appropriate power-on of semiconductor device 10b according to the second embodiment can be ensured by fine adjustment of the total capacitance value of the capacitors charged with power generation charges based on setting input 11c so as to accommodate product variation in power generation capability (the amount of charges) among environmental power generation devices 100.

For example, in a process for manufacturing products on which environmental power generation device 100 and semiconductor device 10b are mounted, an actual amount of power generation charges of environmental power generation device 100 can be measured and an additional capacitance value resulting from capacitance value adjustment circuit 18 can be adjusted in accordance with the amount of power generation charges. Furthermore, by setting switching of power-on criterion voltage Vdet based on setting input 11v in accordance with the total capacitance value including the adjusted additional capacitance value, a semiconductor device capable of appropriately operating in spite of great manufacturing variation in generated power in environmental power generation device 100 can be provided.

Figure 12:
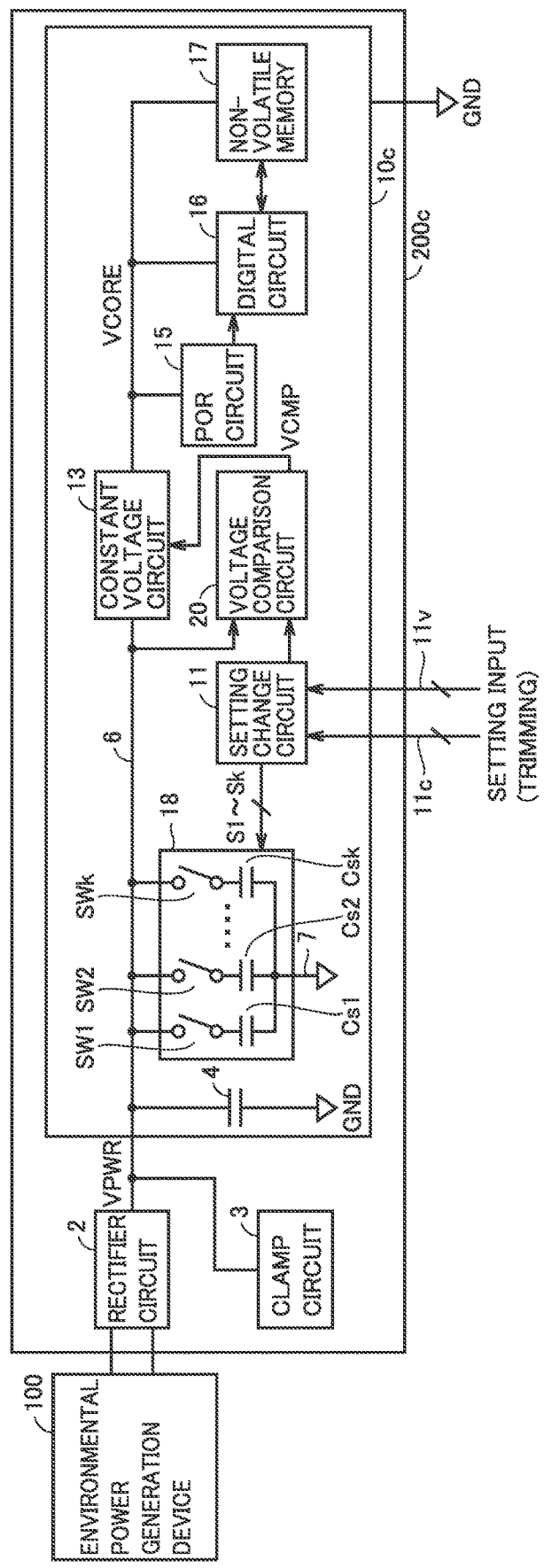
FIG. 12 is a block diagram illustrating a modification of the configuration of the semiconductor device according to the second embodiment.

The configuration in the second embodiment can also be modified as shown in FIG. 12. A semiconductor device 10c and a signal processor 200c according to a modification of the second embodiment shown in FIG. 12 are different from semiconductor device 10b and signal processor 200b in FIG. 11 in that capacitor 4 (main capacitor) is arranged in the inside of semiconductor device 10c equipped with capacitance value adjustment circuit 18. The configuration in FIG. 12 can also similarly achieve an effect obtained by the configuration according to the second embodiment.

Third Embodiment

A batteryless multi-turn encoder to which the semiconductor device according to the first embodiment is applied will be described in a third embodiment.

Figure 13:
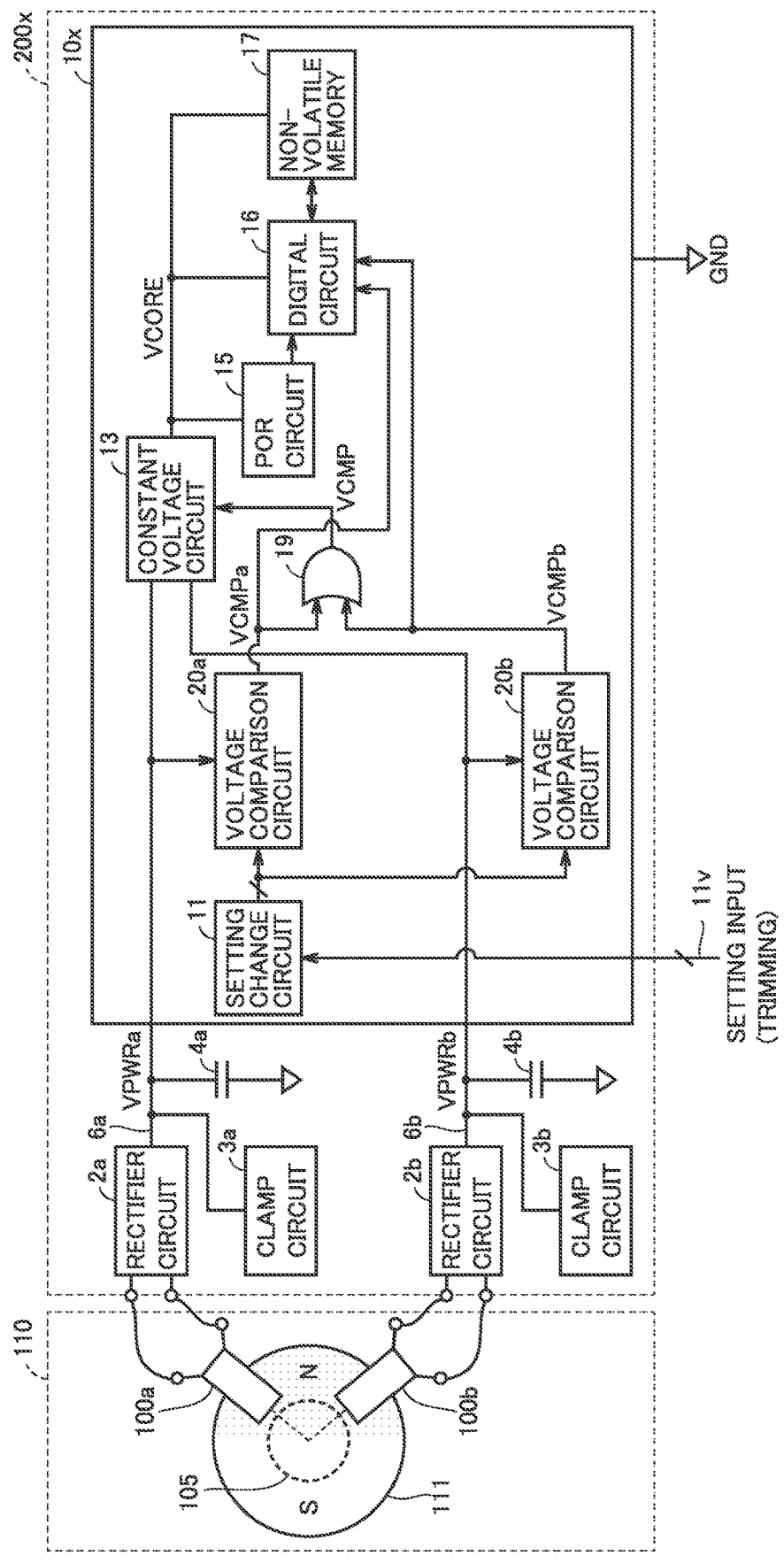
FIG. 13 is a block diagram showing an exemplary configuration of a multi-turn encoder according to a third embodiment.

FIG. 13 is a block diagram showing an exemplary configuration of the batteryless multi-turn encoder according to the third embodiment.

As shown in FIG. 13, the multi-turn encoder according to the third embodiment detects a rotation direction and the number of rotations of a rotation shaft 105 which is a detection target and holds data representing a result of detection, without external supply of electric power. The multi-turn encoder includes a rotation detection mechanism 110 to detect rotation of rotation shaft 105 and a signal processor 200x electrically connected to rotation detection mechanism 110.

Rotation detection mechanism 110 includes a magnet 111 attached to rotation shaft 105 and power generation elements 100a and 100b. Though rotation shaft 105 is made up, for example, of an output shaft (rotation shaft) of a motor, it can be made up of any rotating body rotatable in a direction around an axis.

Magnet 111 is in a shape of a disc and attached concentrically with rotation shaft 105. Therefore, magnet 111 can rotate in both of a clockwise direction and a counterclockwise direction in coordination with rotation shaft 105. Magnet 111 can be attached to the rotation shaft with any structure so long as magnet 111 rotationally moves in coordination with rotational movement of rotation shaft 105. Though magnet 111 configured to include two magnetic poles each covering a semicircumference is exemplified in the present embodiment, any number of magnetic poles can be set. The shape of magnet 111 is not limited to the shape of the disc either.

Power generation elements 100a and 100b can each be composed of a combination of a magnetic wire with a large Barkhausen effect and a pick-up coil arranged above magnet 111 on a circumference around which magnet 111 rotates. Power generation elements 100a and 100b are adapted to environmental power generation device 100 in the first and second embodiments, and generate power generation pulses with rotation of magnet 111 with rotation of rotation shaft 105. Though a configuration in which two power generation elements 100a and 100b are provided is exemplified in the present embodiment, any number of power generation elements may be provided.

Signal processor 200x includes rectifier circuits 2a and 2b, clamp circuits 3a and 3b, capacitors 4a and 4b, power supply lines 6a and 6b, and a semiconductor device 10x according to the third embodiment.

Power generation pulses are outputted from power generation element 100a to power supply line 6a through rectifier circuit 2a. Clamp circuit 3a and capacitor 4a are connected to power supply line 6a. Similarly, power generation pulses are outputted from power generation element 100b to power supply line 6b through rectifier circuit 2b. Clamp circuit 3b and capacitor 4b are connected to power supply line 6b.

In signal processor 200x, two sets of rectifier circuit 2, power supply line 6, clamp circuit 3, and capacitor 4 in the first embodiment are arranged for two respective power generation elements 100a and 100b. As capacitor 4a is charged with power generation charges from power generation element 100a, a power generation voltage VPWRa on power supply line 6a increases. Similarly, as capacitor 4b is charged with power generation charges from power generation element 100b, a power generation voltage VPWRb on power supply line 6b increases.

Semiconductor device 10x is different from semiconductor device 10a in FIG. 1 in including voltage comparison circuits 20a and 20b similar to voltage comparison circuit 20 (FIG. 1) in correspondence with power supply lines 6a and 6b, respectively, and further including a logic gate 19 to generate voltage detection signal VCMP. Constant voltage circuit 13 is powered on in response to voltage detection signal VCMP from logic gate 19. Operations of constant voltage circuit 13, POR circuit 15, digital circuit 16, and non-volatile memory 17 are the same in function as described in the first embodiment.

Voltage comparison circuit 20a compares power generation voltage VPWRa on power supply line 6a and power-on criterion voltage Vdet with each other and outputs a signal VCMPa when a condition of VPWRa Vdet is satisfied. Similarly, voltage comparison circuit 20b compares a power generation voltage VPWRb on power supply line 6b and power-on criterion voltage Vdet with each other and outputs a signal VCMPb when a condition of VPWRb Vdet is satisfied.

Power-on criterion voltage Vdet is set in common to voltage comparison circuits 20a and 20b. As in the first embodiment, power-on criterion voltage Vdet can be switched based on setting input 11v to setting change circuit 11.

Logic gate 19 outputs a result of logical sum (OR) operation of signal VCMPa or VCMPb as voltage detection signal VCMP to constant voltage circuit 13. Therefore, when one of power generation voltages VPWRa and VPWRb attains to power-on criterion voltage Vdet or higher, constant voltage circuit 13 is powered on. Then, when POR circuit 15 detects stabilization of power supply voltage VCORE outputted from constant voltage circuit 13, reset of digital circuit 16 is cancelled and digital circuit 16 starts processing incorporated in advance.

Furthermore, in the third embodiment, output signal VCMPa from voltage comparison circuit 20a and output signal VCMPb from voltage comparison circuit 20b are provided to digital circuit 16. Digital circuit 16 can recognize based on signals VCMPa and VCMPb, from which of power generation elements 100a and 100b it operates with power generation pulses.

Semiconductor device 10x included in the multi-turn encoder is powered on to perform processing incorporated in advance each time power generation pulses having a voltage equal to or higher than power-on criterion voltage Vdet are outputted from power generation element 100a or 100b. In the processing, for example, information on a multi-rotation value (count value data) representing the rotation direction and the number of rotations of rotation shaft 105 is read from non-volatile memory 17. Furthermore, when the information (count value data) on the multi-rotation value is updated upon detection of power generation pulses in accordance with a predetermined conversion table, the updated information (count value data) of the multiple rotation value is written in non-volatile memory 17. The information (count value data) representing the rotation direction and the number of rotations of rotation shaft 105 is thus held in non-volatile memory 17. Any known technique such as the technique described in Japanese Patent No. 5511748 can be applied to processing in reflection of the detected power generation pulses on the count value data.

The batteryless multi-turn encoder according to the third embodiment can thus count the number of rotations of rotation shaft 105 upon detection of power generation pulses outputted from power generation elements 100a and 100b with rotation of rotation shaft 105.

In the batteryless multi-turn encoder according to the third embodiment, magnet 111 and/or power generation elements 100a and 100b may have to be changed in conformity with rotation shaft 105 (motor) of interest of detection. In such a case, change of magnet 111 or power generation elements 100a and 100b changes the amount of power generation charges from environmental power generation device 100. As described in the first embodiment, however, by adjusting the capacitance value of capacitor 4 in accordance with the amount of power generation charges and further providing a mechanism to variably set power-on criterion voltage Vdet in accordance with the capacitance value of capacitor 4, semiconductor device 10x can appropriately be powered on so that the multi-turn encoder can appropriately operate.

Though an example in which power generation elements 100a and 100b are each composed of a combination of the magnetic wire and the pick-up coil is shown in the third embodiment, the power generation element is not limited to such a configuration. For example, when a rotation speed of rotation shaft 105 is high, the power generation element may be made up only of a coil and electric power can be generated by electromagnetic induction.

Fourth Embodiment

In the multi-turn encoder according to the third embodiment, as digital circuit 16 operates in response to power generation voltage VPWR (VPWRa, VPWRb) attaining to power-on criterion voltage Vdet or higher owing to power generation pulses generated with rotation of rotation shaft 105, the number of rotations of rotation shaft 105 is counted.

Therefore, when power generation voltage VPWR (VPWRa, VPWRb) does not increase to power-on criterion voltage Vdet in spite of generation of power generation pulses, the multi-turn encoder is unable to recognize generation of the power generation pulses. Therefore, even when rotation shaft 105 rotates, due to missed detection of power generation pulses called pulse dropout, the number of rotations of rotation shaft 105 may not accurately be counted.

Figure 14:
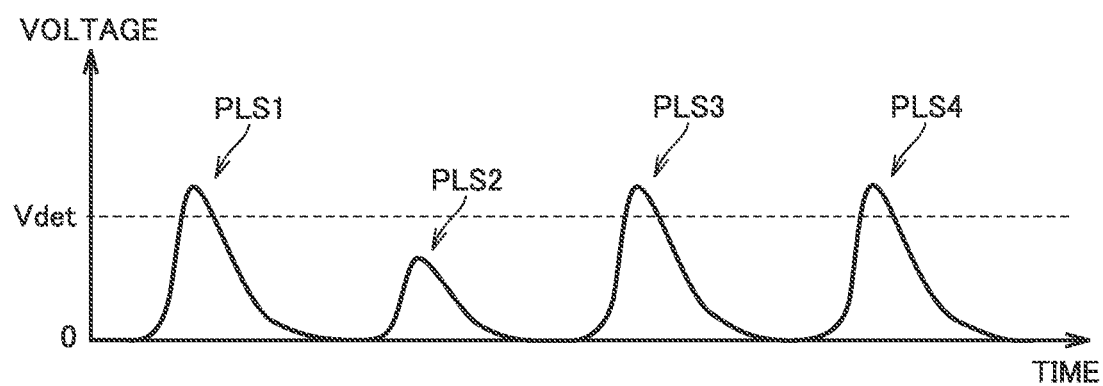
FIG. 14 is a conceptual waveform diagram of a power generation pulse for illustrating pulse dropout.

FIG. 14 shows a conceptual waveform diagram of a power generation pulse for illustrating pulse dropout.

As shown in FIG. 14, power generation voltage VPWR varies with generation of power generation pulses PLS1 to PLS4. Waveforms of power generation pulses PLS1 to PLS4 are those after passage through rectifier circuit 2 (2a, 2b). At the time of generation of power generation pulse PLS2, however, power generation voltage VPWR has not increased to power-on criterion voltage Vdet. Therefore, in semiconductor device 10x, generation of power generation pulses PLS1, PLS3, and PLS4 can be detected based on comparison between power generation voltage VPWR and power-on criterion voltage Vdet, whereas generation of power generation pulse PLS2 cannot be detected. Thus, generation at a certain probability, of a power generation pulse at a low voltage with rotation of rotation shaft 105 may cause pulse dropout.

By applying the technique described in aforementioned Japanese Patent No. 5511748, even on the occurrence of pulse dropout, accurate count of the number of rotations of rotation shaft 105 may be continued by making correction at the time of subsequent detection of power generation pulses (power generation pulses PLS3 and PLS4 in FIG. 14). When pulse dropout occurs consecutively a plurality of times, however, there is a concern about difficulty in correction. In this case, operation of the multi-turn encoder is stopped as necessary, and a warning is transmitted to a higher-order system. Though a frequency of occurrence of such uncorrectable pulse dropout is low, pulse dropout may occur. Therefore, by lowering the frequency of occurrence of pulse dropout, the probability of occurrence of stop of the operation of the multi-turn encoder can be lowered.

Figure 15:
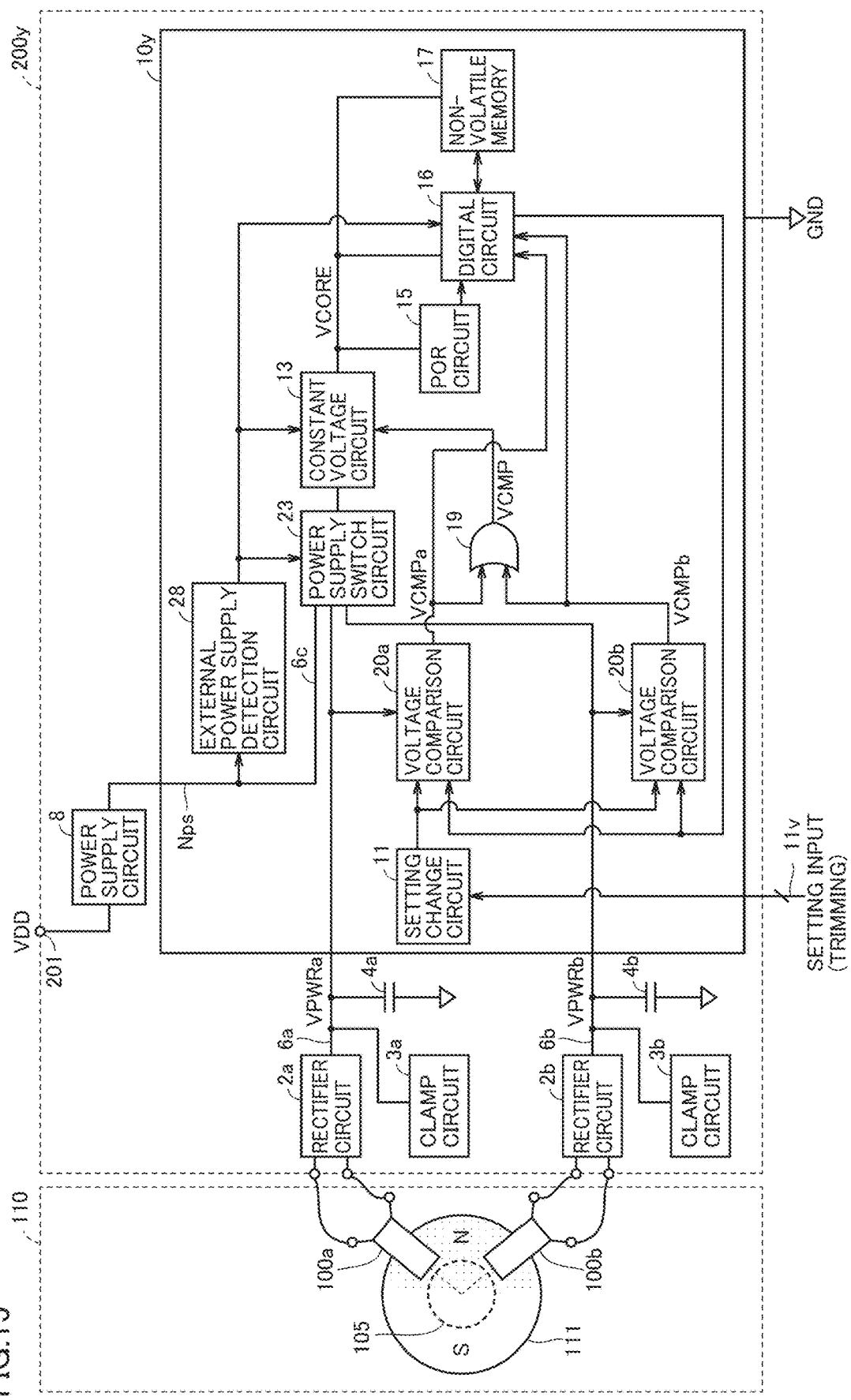
FIG. 15 is a block diagram showing an exemplary configuration of a semiconductor device and a multi-turn encoder according to a fourth embodiment.

FIG. 15 is a block diagram showing a configuration of a batteryless multi-turn encoder according to a fourth embodiment.

As shown in FIG. 15, the multi-turn encoder according to the fourth embodiment includes rotation detection mechanism 110 as in the third embodiment and a signal processor 200y electrically connected to rotation detection mechanism 110. In other words, the multi-turn encoder according to the fourth embodiment is different from the multi-turn encoder according to the third embodiment (FIG. 13) in including signal processor 200y instead of signal processor 200x.

Signal processor 200y includes a power supply terminal 201 to receive input of an external power supply voltage VDD, a power supply circuit 8, and a semiconductor device 10y according to the fourth embodiment. Semiconductor device 10y is different from semiconductor device 10x according to the third embodiment in further including a power supply line 6c, a power supply switch circuit 23, and an external power supply detection circuit 28. Power supply line 6c corresponds to the "power supply node."

Power supply circuit 8 converts external power supply voltage VDD inputted to power supply terminal 201 into a direct-current (DC) voltage comparable to an input voltage to constant voltage circuit 13. The DC voltage from power supply circuit 8 is outputted to power supply line 6c. External power supply detection circuit 28 detects whether or not the external power supply voltage is inputted. A state in which the external power supply voltage is inputted and a state in which the external power supply voltage is not inputted are also referred to as "external power supply on" and "exteRNal power supply off" below, respectively.

For example, external power supply detection circuit 28 detects one state of external power supply on and external power supply off based on comparison between a criterion voltage determined in conformity with a level of an input voltage to constant voltage circuit 13 and power supply line 6c. A result of detection by external power supply detection circuit 28 is transmitted to power supply switch circuit 23, constant voltage circuit 13, and digital circuit 16.

Power supply switch circuit 23 allows connection of power supply line 6c to an input side of constant voltage circuit 13 when the external power supply is on. When the external power supply is off, on the other hand, power supply switch circuit 23 allows connection of power supply lines 6a and 6b to the input side of constant voltage circuit 13.

Therefore, operation of semiconductor device 10y while the external power supply is off is similar to that of semiconductor device 10x. Specifically, power supply voltage VCORE of semiconductor device 10y is generated from power generation voltages VPWRa and VPWRb on power supply lines 6a and 6b. On the other hand, while the external power supply is on, power supply voltage VCORE is generated from the external power supply voltage inputted to power supply terminal 201. While the external power supply is on, electric power of power generation pulses is used only as power supply for setting change circuit 11 and voltage comparison circuits 20a and 20b and an input voltage to comparator 24 (FIGS. 7 to 9). Therefore, energy comparable to amount of charges Qstr described with reference to FIG. 10 does not have to be secured by power generation pulses. Consequently, electric power (or the amount of charges) required for power generation pulses is lower than that while the external power supply is off. Therefore, even when power-on criterion voltage Vdet is lowered as compared with that while the external power supply is off, semiconductor device 10y can be powered on.

Therefore, the semiconductor device according to the fourth embodiment is characterized in switching power-on criterion voltage Vdet as being different between while the external power supply is on and while the external power supply is off.

Figure 16:
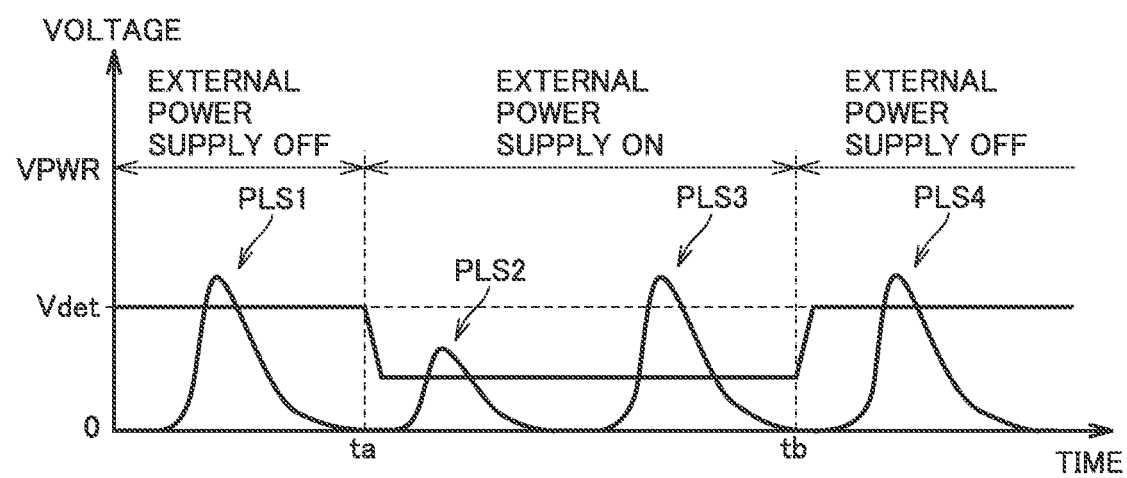
FIG. 16 is a conceptual waveform diagram for illustrating setting of a power-on criterion voltage in the semiconductor device according to the fourth embodiment.

FIG. 16 shows a conceptual waveform diagram for illustrating setting of power-on criterion voltage Vdet in the semiconductor device according to the fourth embodiment.

As shown in FIG. 16, in the semiconductor device according to the fourth embodiment, power-on criterion voltage Vdet while the external power supply is on between time ta and time tb is set to be lower than power-on criterion voltage Vdet while the external power supply is off (before time ta and after time tb). As power generation pulse PLS2 that has not been detectable in FIG. 14 thus becomes detectable, the probability of occurrence of pulse dropout can be lowered. In other words, the state of external power supply on corresponds to the "first state" and the state of external power supply off corresponds to the "second state."

An exemplary configuration of the voltage comparison circuit and the setting change circuit for enabling switching of power-on criterion voltage Vdet shown in FIG. 16 will be described with reference to FIGS. 17 and 18.

Figure 17:
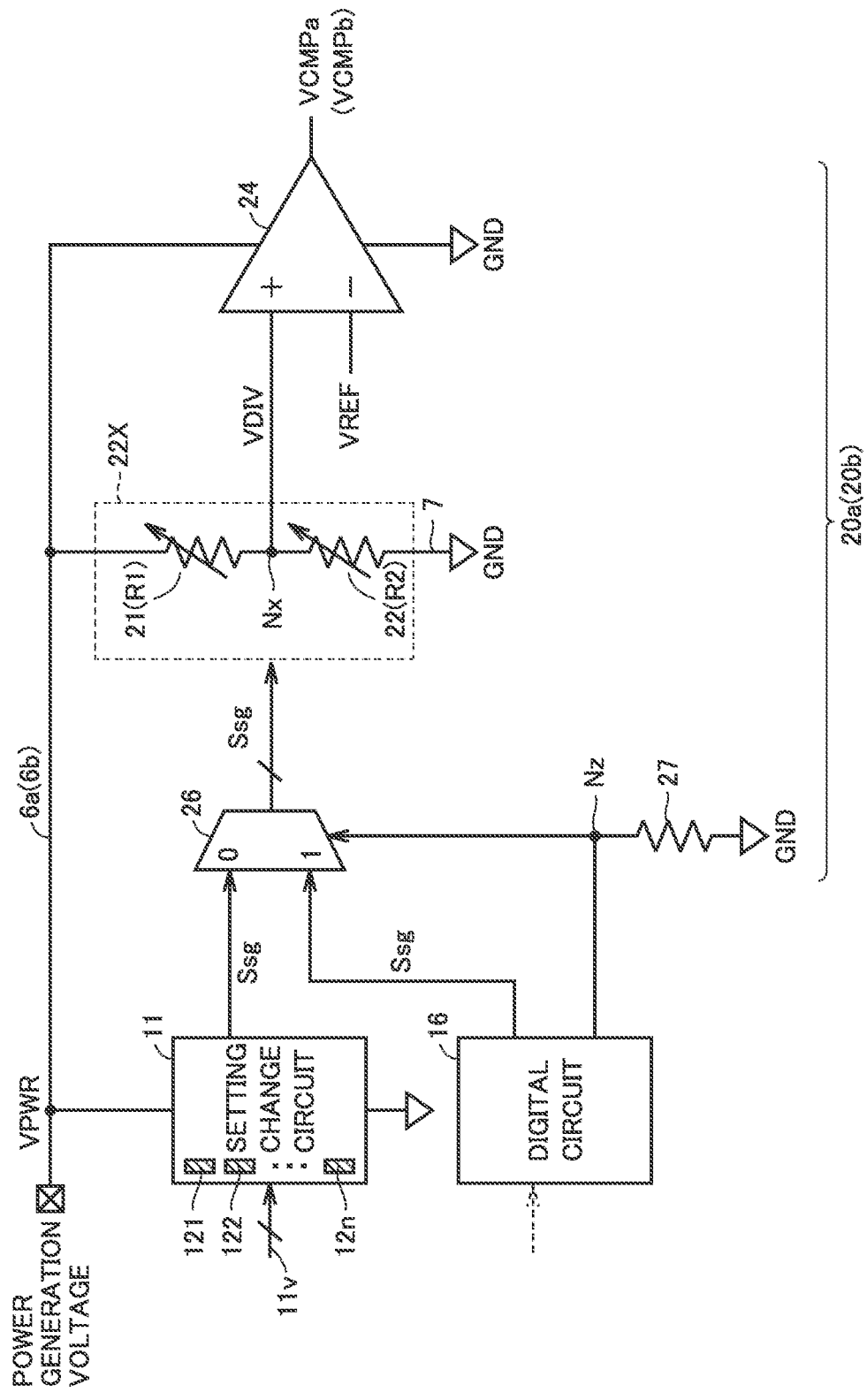
FIG. 17 is a block diagram illustrating a first exemplary configuration of the voltage comparison circuit and the setting change circuit in the semiconductor device according to the fourth embodiment.

FIG. 17 shows a mechanism to switch power-on criterion voltage Vdet as being different between while the external power supply is on and while the external power supply is off with the use of voltage comparison circuit 20 and setting change circuit 11 shown in FIG. 7.

Voltage comparison circuit 20 shown in FIG. 17 is different from voltage comparison circuit 20 in FIG. 7 in further including a selector 26 and a pull-down resistor 27. Selector 26 selects one of control signal Ssg from setting change circuit 11 and control signal Ssg from digital circuit 16 in accordance with a voltage level at a node Nz and transmits the selected control signal to voltage division circuit 22X as in FIG. 7. Digital circuit 16 can output control signal Ssg set in accordance with control incorporated in advance. Alternatively, control signal Ssg can also be set or modified by writing of data for generating control signal Ssg into digital circuit 16 as shown with a dotted line in the figure.

While the external power supply is off, digital circuit 16 is unable to operate until power generation voltage VPWR increases. Therefore, node Nx is set to ground voltage GND (L level) by pull-down resistor 27. At this time, selector 26 transmits control signal Ssg from setting change circuit 11 inputted on a "0" side to voltage division circuit 22X.

In contrast, while the external power supply is on, digital circuit 16 can output a voltage at the H level (VCORE) to node Nx with power supply voltage VCORE generated from the external power supply voltage and can output control signal Ssg set in advance. In response, selector 26 transmits control signal Ssg from digital circuit 16 inputted to a "1" side to voltage division circuit 22X.

Therefore, while the external power supply is off, by changing the voltage division ratio of voltage division circuit 22X in accordance with control signal Ssg in accordance with setting input 11v to setting change circuit 11 as in the first embodiment, power-on criterion voltage Vdet can variably be set. Furthermore, while the external power supply is on, by changing the voltage division ratio of voltage division circuit 22X in accordance with control signal Ssg in accordance with a setting input 11d inputted to digital circuit 16 in advance, power-on criterion voltage Vdet can variably be set.

Figure 18:
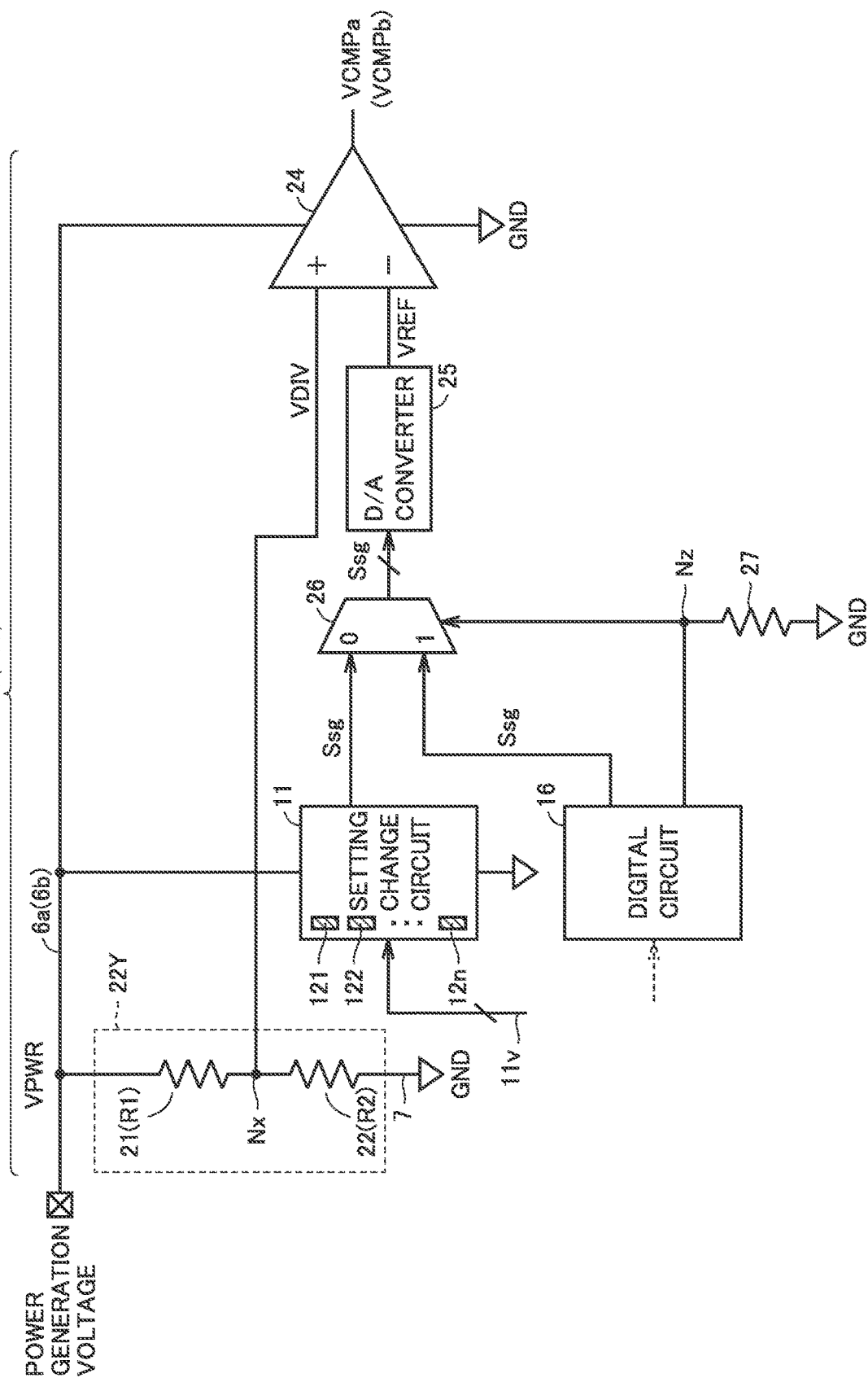
FIG. 18 is a block diagram illustrating a second exemplary configuration of the voltage comparison circuit and the setting change circuit in the semiconductor device according to the fourth embodiment.

FIG. 18 shows a mechanism to switch power-on criterion voltage Vdet as being different between while the external power supply is on and while the external power supply is off with the use of voltage comparison circuit 20 and setting change circuit 11 shown in FIG. 8.

Voltage comparison circuit 20 shown in FIG. 18 is different from voltage comparison circuit 20 in FIG. 8 in further including selector 26 and pull-down resistor 27 as in FIG. 17. In the configuration in FIG. 18 as well, while the external power supply is off, selector 26 transmits control signal Ssg from setting change circuit 11 inputted to the "0" side to D/A converter 25. In contrast, while the external power supply is on, selector 26 transmits control signal Ssg from digital circuit 16 inputted to the "1" side to D/A converter 25.

Therefore, while the external power supply is off, as in the first embodiment, by changing reference voltage VREF in accordance with control signal Ssg in accordance with setting input 11v to setting change circuit 11, power-on criterion voltage Vdet can variably be set. Furthermore, while the external power supply is on, by changing reference voltage VREF in accordance with control signal Ssg set in advance in accordance with setting input 11d to digital circuit 16, power-on criterion voltage Vdet can variably be set.

Consequently, according to the configuration in each of FIGS. 17 and 18, power-on criterion voltage Vdet while the external power supply is on can variably be set separately from the power-on criterion voltage while the external power supply is off. Furthermore, in the configuration in FIGS. 17 and 18, setting inputs 11v and 11d are set such that power-on criterion voltage Vdet set in accordance with control signal Ssg from digital circuit 16 is lower than power-on criterion voltage Vdet set in accordance with control signal Ssg from setting change circuit 11, and thus power-on criterion voltage Vdet shown in FIG. 16 can be switched. In other words, power-on criterion voltage Vdet while the external power supply is on can be set to be lower than power-on criterion voltage Vdet while the external power supply is off.

Alternatively, when terminal 11x as in FIG. 9 is provided, an analog voltage externally inputted as reference voltage VREF can be switched in coordination with supply of external power supply voltage VDD.

Modification of Fourth Embodiment

Figure 19:
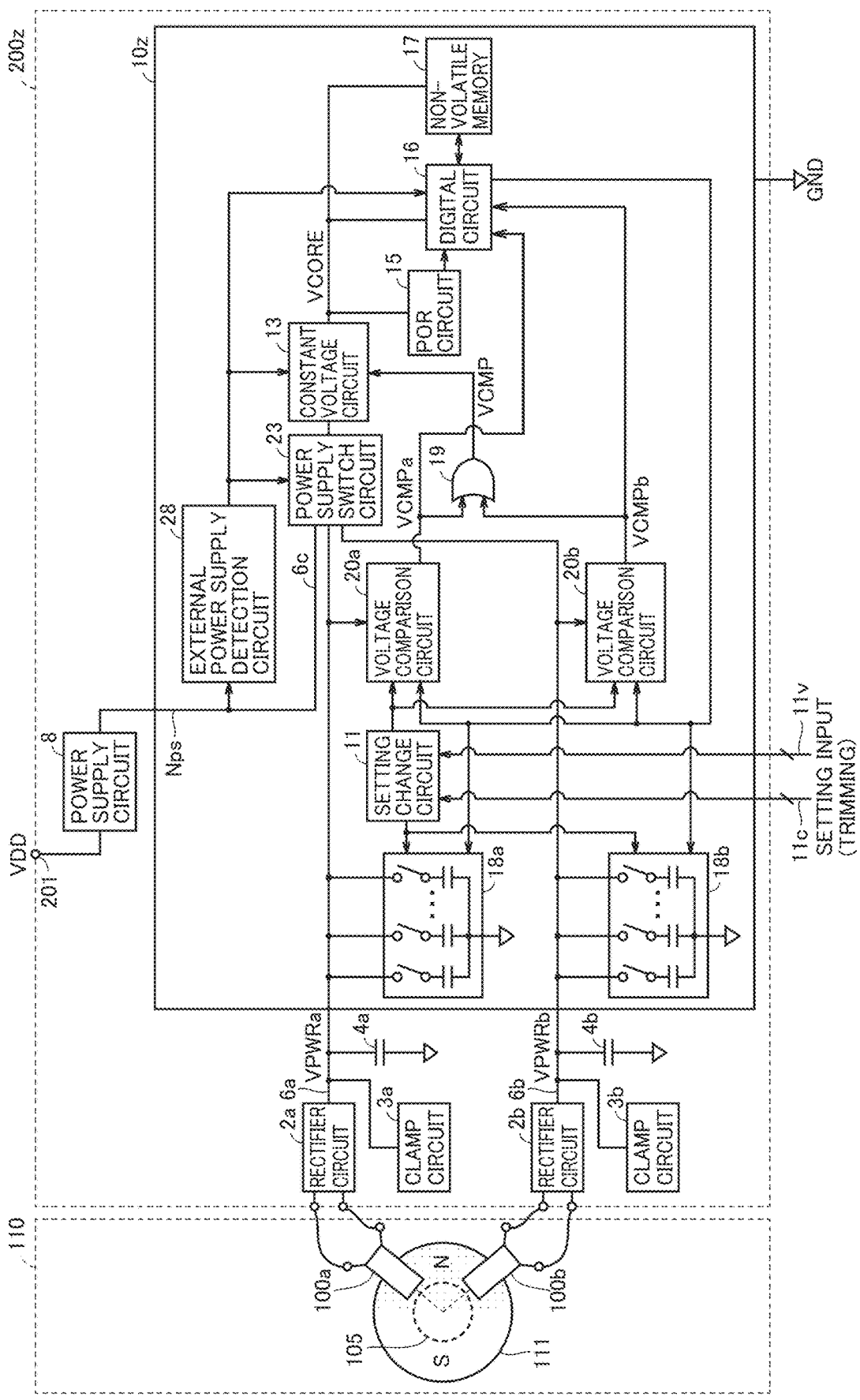
FIG. 19 is a block diagram showing an exemplary configuration of a semiconductor device and a multi-turn encoder according to a modification of the fourth embodiment.

FIG. 19 shows a block diagram showing an exemplary configuration of a semiconductor device and a multi-turn encoder according to a modification of the fourth embodiment.

As shown in FIG. 19, a semiconductor device 10z according to the modification of the fourth embodiment is different from semiconductor device 10y according to the fourth embodiment in further including capacitance value adjustment circuits 18a and 18b similar to capacitance value adjustment circuit 18 in the second embodiment. Capacitance value adjustment circuits 18a and 18b are connected to power supply lines 6a and 6b, respectively. An additional capacitance value connected by capacitance value adjustment circuits 18a and 18b can be adjusted in common by a control signal from setting change circuit 11 as in the second embodiment. A signal processor 200z shown in FIG. 19 is configured such that semiconductor device 10z to which capacitance value adjustment circuits 18a and 18b are added is mounted thereon.

Semiconductor device 10z can operate also with external power supply voltage VDD provided to power supply terminal 201 similarly to semiconductor device 10y. While the external power supply is on, on the other hand, electric power (or the amount of charges) required for power generation pulses is lower than that while the external power supply is off as described above. Therefore, in semiconductor device 10z, a voltage of the power generation pulses may exceed the maximum operating voltage while the external power supply is on.

Therefore, in semiconductor device 10z, while the external power supply is on, in order to lower the voltage of the power generation pulses, preferably, control to set the capacitance value of the sub capacitor additionally connected (additional capacitance value) owing to capacitance value adjustment circuit 18 (18a and 18b) to be larger than that while the external power supply is off is introduced.

For example, with the circuit configuration as in FIGS. 17 and 18, while the external power supply is off, the control signal for capacitance value adjustment circuit 18 (18a and 18b) is generated in accordance with the control signal from setting change circuit 11, whereas while the external power supply is on, the control signal for capacitance value adjustment circuit 18 can be generated in accordance with the control signal from digital circuit 16. Thus, the additional capacitance value resulting from capacitance value adjustment circuit 18 (18a and 18b) can individually be set variably between the additional capacitance value while the external power supply is on and the additional capacitance value while the external power supply is off. Furthermore, setting input 11c to setting change circuit 11 and setting input 11d to digital circuit 16 can be set such that the additional capacitance value set based on the control signal from digital circuit 16 is larger than the additional capacitance value set based on the control signal from setting change circuit 11. The voltage of the power generation pulses while the external power supply is on can thus be lowered.

Though not shown, capacitance value adjustment circuits 18a and 18b as in FIG. 19 can also be connected to power supply lines 6a and 6b, respectively, also in semiconductor device 10y shown in FIG. 14.

Though environmental power generation device 100 to intermittently output power generation pulses at a positive voltage or power generation pulses at a negative voltage is assumed in the present embodiment, the semiconductor device and the multi-turn encoder according to the present embodiment can also be applied to environmental power generation device 100 to intermittently output power generation pulses only at the positive voltage. In this case, a configuration without arrangement of rectifier circuit 2 (2a and 2b) shown in FIG. 1 or the like is applicable. For confirmation purpose, combination as appropriate of features described in the plurality of embodiments described above including combination not mentioned in the specification is also originally intended within the scope where there is no inconsistency or contradiction.

It should be understood that the embodiments disclosed herein are illustrative and non-restrictive in every respect. The technical scope according to the present disclosure is defined by the terms of the claims rather than the description above and is intended to include any modifications within the scope and meaning equivalent to the terms of the claims.

REFERENCE SIGNS LIST 2, 2a, 2b rectifier circuit; 3, 3a, 3b clamp circuit; 4, 4a, 4b capacitor; 6, 6a, 6b, 6c power supply line; 7 ground line; 8 power supply circuit; 10a to 10c, 10x to 10z semiconductor device; 11 setting change circuit; 11c, 11v setting input; 11x terminal; 12, 121 to 12n trimming element; 13 constant voltage circuit; 15 POR circuit; 16 digital circuit; 17 non-volatile memory; 18, 18a, 18b capacitance value adjustment circuit; 19 logic gate; 20, 20a, 20b voltage comparison circuit; 21, 22 resistive element; 22X, 22Y voltage division circuit; 23 power supply switch circuit; 24 comparator; 25 digital-analog converter; 26 selector; 27 pull-down resistor; 28 external power supply detection circuit; 100 environmental power generation device; 100a, 100b power generation element; 105 rotation shaft; 110 rotation detection mechanism; 111 magnet; 200a to 200c, 200x to 200z signal processor; 201 power supply terminal; Cchg, Cchg1 to Cchg3 capacitance value; Cs, Cs1 to Csk sub capacitor; GND ground voltage; PLS1 to PLS4 power generation pulse; S1 to Sk, Ssg control signal; SW1 to SWk switch; VCMP voltage detection signal; VCORE power supply voltage; VDD external power supply voltage; VDIV divided voltage; VPWR, VPWRa, VPWRb power generation voltage; VREF reference voltage; Vdet power-on criterion voltage; Vmax upper limit voltage; Vopmax maximum operating voltage; Vopmin minimum operating voltage

The invention claimed is:

1. A semiconductor device connected to a power supply line to which power generation charges from an environmental power generation device are outputted, the semiconductor device comprising:
   a voltage comparison circuit to output a voltage detection signal when a power generation voltage corresponding to a charging voltage for a capacitor connected to the power supply line is equal to or higher than a power-on criterion voltage;
   an internal circuit powered on in response to the voltage detection signal from the voltage comparison circuit; and
   a setting change circuit to switch the power-on criterion voltage in accordance with a first setting input.

2. The semiconductor device according to claim 1, wherein
   the power-on criterion voltage when the capacitor has a first capacitance value is set to a voltage higher than the power-on criterion voltage when the capacitor has a second capacitance value larger than the first capacitance value.

3. The semiconductor device according to claim 1, wherein
   the power-on criterion voltage is set in accordance with a sum of a value calculated by dividing a predetermined amount of consumed charges for performing processing incorporated in advance after the internal circuit is powered on by a capacitance value of the capacitor and a predetermined minimum operating voltage of the semiconductor device.

4. The semiconductor device according to claim 1, wherein the voltage comparison circuit includes
   a voltage division circuit to divide the power generation voltage, and
   a comparator to compare a divided voltage outputted from the voltage division circuit and a predetermined reference voltage with each other to output the voltage detection signal,
   the setting change circuit generates a first control signal in accordance with the first setting input, and
   the voltage division circuit is configured such that a voltage division ratio is variable in accordance with the first control signal.

5. The semiconductor device according to claim 4, wherein
   the setting change circuit includes a plurality of first trimming elements capable of trimming in accordance with the first setting input,
   the setting change circuit generates the first control signal as a first digital signal for which a ground voltage and the power generation voltage are defined as a logic low level and a logic high level, respectively, and
   each bit of the first digital signal is set to one of the logic low level and the logic high level depending on whether trimming by each of the first trimming elements is done.

6. The semiconductor device according to claim 1, wherein
   the setting change circuit generates a first control signal in accordance with the first setting input, and
   the voltage comparison circuit includes
   a voltage division circuit to divide the power generation voltage, a voltage generator to output a reference voltage in accordance with the first control signal, and a comparator to compare a divided voltage resulting from voltage division by the voltage division circuit and the reference voltage outputted from the voltage generator with each other to output the voltage detection signal.

7. The semiconductor device according to claim 1, wherein the setting change circuit includes a first terminal to receive input of an analog voltage as the first setting input from outside of the semiconductor device, and the voltage comparison circuit includes a voltage division circuit to divide the power generation voltage, and a comparator to compare a divided voltage outputted from the voltage division circuit and an input voltage to the first terminal with each other to output the voltage detection signal.

8. The semiconductor device according to claim 1, wherein the setting change circuit further receives a second setting input and generates a second control signal in accordance with the second setting input, and the semiconductor device further comprises a capacitance value adjustment circuit to connect to the power supply line, an auxiliary capacitor having a variable additional capacitance value in accordance with the second control signal.

9. The semiconductor device according to claim 8, wherein the setting change circuit further includes a plurality of second trimming elements capable of trimming in accordance with the second setting input, the setting change circuit generates the second control signal as a second digital signal for which a ground voltage and the power generation voltage are defined as a logic low level and a logic high level, respectively, and each bit of the second digital signal is set to one of the logic low level and the logic high level depending on whether trimming by each of the second trimming elements is done.

10. The semiconductor device according to claim 8, further comprising:

a power supply node to receive input of an external power supply voltage from outside of the semiconductor device;

an external power supply detection circuit to detect input of the external power supply voltage based on a voltage of the power supply node; and a power supply switch circuit to switch between a first state in which a power supply voltage of the internal circuit is generated from the power generation voltage of the power supply line and a second state in which the power supply voltage is generated from the external power supply voltage of the power supply node based on a result of detection by the external power supply detection circuit, wherein based on the result of detection by the external power supply detection circuit, in the first state, the voltage comparison circuit controls the additional capacitance value to a first value in accordance with the second control signal, whereas in the second state, the voltage comparison circuit controls the additional capacitance value to a second value larger than the first value.

11. The semiconductor device according to claim 1, further comprising:

a power supply node to receive input of an external power supply voltage from outside of the semiconductor device;

an external power supply detection circuit to detect input of the external power supply voltage based on a voltage of the power supply node; and a power supply switch circuit to switch between a first state in which a power supply voltage of the internal circuit is generated from the external power supply voltage of the power supply node and a second state in which the power supply voltage is generated from the power generation voltage of the power supply line based on a result of detection by the external power supply detection circuit, wherein based on the result of detection by the external power supply detection circuit, the voltage comparison circuit switches the power-on criterion voltage between the first state and the second state so as to set the power-on criterion voltage in the first state to be lower than in the second state.

12. The semiconductor device according to claim 1, wherein the internal circuit includes a constant voltage circuit powered on in response to the voltage detection signal to generate a power supply voltage by using the power generation voltage from the power supply line as input, and a digital circuit to operate upon receiving the power supply voltage from the constant voltage circuit, and the digital circuit performs reading and writing of data from and into a non-volatile memory arranged on outside of the semiconductor device while the digital circuit operates.

13. A multi-turn encoder to detect the number of rotations of a rotation shaft, the multi-turn encoder comprising:

the semiconductor device according to claim 1, wherein the environmental power generation device is composed of a power generation element including a magnetic wire with a large Barkhausen effect, the magnetic wire being attached to a magnet that rotationally moves in coordination with the rotation shaft, and the internal circuit is powered on each time a voltage pulse having the power generation voltage equal to or higher than the power-on criterion voltage is outputted from the power generation element to count a multi-rotation value of the rotation shaft.

14. The semiconductor device according to claim 1, wherein the internal circuit includes a constant voltage circuit powered on in response to the voltage detection signal to generate a power supply voltage by using the power generation voltage from the power supply line as input, a digital circuit to operate upon receiving the power supply voltage from the constant voltage circuit, and a non-volatile memory for input and output of data to and from the digital circuit while the digital circuit operates.

15. The semiconductor device according to claim 14, further comprising:

a power supply node to receive input of an external power supply voltage from outside of the semiconductor device;

an external power supply detection circuit to detect input of the external power supply voltage based on a voltage of the power supply node; and a power supply switch circuit to allow the power supply node to be connected to the constant voltage circuit while the external power supply voltage is inputted and to allow the power supply line to be connected to the constant voltage circuit while the external power supply voltage is not inputted, based on a result of detection by the external power supply detection circuit, wherein the voltage comparison circuit is configured to set the power-on criterion voltage while the external power supply voltage is inputted to be lower than that while the external power supply voltage is not inputted, based on the result of detection by the external power supply detection circuit.

16. The semiconductor device according to claim 14, wherein the digital circuit performs a series of processing including detecting, when the power generation voltage equal to or higher than the power-on criterion voltage is detected, that power generation voltage as an input pulse, reading, when the digital circuit detects the input pulse, count value data from the non-volatile memory, updating the count value data in accordance with the detecting, and writing the updated count value data into the non-volatile memory.

* * * * *